US006826842B2

(12) United States Patent
Abe et al.

(10) Patent No.: US 6,826,842 B2
(45) Date of Patent: Dec. 7, 2004

(54) AZIMUTH METER

(75) Inventors: Yasunori Abe, Mohka (JP); Osamu Shimoe, Kumagaya (JP)

(73) Assignee: Hitachi Metals, Ltd., Tokyo (JP)

( * ) Notice: Subject to any disclaimer, the term of this patent is extended or adjusted under 35 U.S.C. 154(b) by 0 days.

(21) Appl. No.: 10/474,131

(22) PCT Filed: May 21, 2002

(86) PCT No.: PCT/JP02/04909

§ 371 (c)(1),
(2), (4) Date: Oct. 6, 2003

(87) PCT Pub. No.: WO02/095330

PCT Pub. Date: Nov. 28, 2002

(65) Prior Publication Data

US 2004/0111906 A1 Jun. 17, 2004

(30) Foreign Application Priority Data

May 22, 2001 (JP) ........................................ 2001-153068

(51) Int. Cl.[7] .......................... G01C 17/02; G01R 33/02
(52) U.S. Cl. ..................................... 33/355 R; 324/252
(58) Field of Search ............................. 33/355 R, 356, 33/361, 363 Q, 363 R; 324/252, 207.12

(56) References Cited

U.S. PATENT DOCUMENTS

| 4,296,377 A | * | 10/1981 | Ohkubo | 324/252 |
|---|---|---|---|---|
| 4,492,922 A | * | 1/1985 | Ohkubo | 324/207.21 |
| 4,700,211 A | * | 10/1987 | Popovic et al. | 257/423 |
| 5,435,070 A | * | 7/1995 | Kilian | 33/361 |
| 5,644,851 A | * | 7/1997 | Blank et al. | 33/361 |
| 5,684,397 A | * | 11/1997 | Ishishita | 324/252 |
| 6,070,333 A | * | 6/2000 | Kutzner et al. | 33/355 R |
| 6,556,007 B1 | * | 4/2003 | Itabashi et al. | 324/252 |

FOREIGN PATENT DOCUMENTS

| JP | 05-157565 A | 6/1993 |
|---|---|---|
| JP | 05-248868 A | 9/1993 |
| JP | 05-322575 A | 12/1993 |
| JP | 06-174471 A | 6/1994 |
| JP | 08-201061 A | 8/1996 |
| JP | 08-233576 A | 9/1996 |
| JP | 08-304074 A | 11/1996 |
| JP | 09-311167 A | 12/1997 |
| JP | 2001-013231 A | 1/2001 |

* cited by examiner

*Primary Examiner*—Diego Gutierrez
*Assistant Examiner*—R. Alexander Smith
(74) *Attorney, Agent, or Firm*—Sughrue Mion, PLLC

(57) ABSTRACT

To provide a thin and small area azimuth meter. A plane coil and at least two groups of thin film magneto resistive elements are arranged. Each of the groups of thin film magneto resistive elements constitutes an MR bridge and detects and outputs two perpendicular components of the earth magnetism, and bearing information is obtained based on the output values.

8 Claims, 24 Drawing Sheets

AZIMUTH METER

TECHNICAL FIELD

The present invention relates to a flat azimuth meter or bearing sensor having a plane coil laminated with thin film magneto resistive elements (hereinafter referred to as "magneto resistive elements") and to a small and light azimuth meter suitable for mobile devices.

BACKGROUND ART

When a current is applied to a magneto resistive element in a direction of an easy axis of magnetization, and at the same time, a magnetic field is applied in a direction perpendicular thereto, an electric resistance in the current direction has a magneto-resistance effect, that is, it is reduced depending on a magnetic field strength. A relationship between the electric resistance (hereinafter referred to as "resistance") and the applied magnetic field strength can substantially be shown as in FIG. 20.

Assuming Hk denotes a saturation magnetic field, when a biasing magnetic field on the order of ½·Hk is applied to a magneto resistive element, there is a substantially linear relationship between an external magnetic field H and the resistance R. An external magnetic field can be measured by using the linear relationship between the external magnetic field H and the resistance R when a certain biasing magnetic field is applied. Then, when each of two components orthogonal to each other of the earth magnetism is detected by two groups of magneto resistive elements that an appropriate bias is applied to, bearings can be measured at a measuring point.

There is used an azimuth meter or a bearing sensor comprising an MR bridge constituted by four magneto resistive elements 91, 92, 93, and 94 that are orthogonal to each other as shown in FIG. 21, and two bias coils 101 and 102 that are wound around a holder mounted outside of the magneto resistive elements so that two orthogonal biasing magnetic fields can be applied both at an angle of 45 degrees with respect to the current directions of the magneto resistive elements. FIG. 22 is a schematic cross-sectional view thereof, and FIG. 23 is a perspective view thereof.

In measurement of bearings, a +x-direction bias is applied by one bias coil 101 (referred to as an x-direction coil) to the four magneto resistive elements 91, 92, 93, and 94 constituting the MR bridge to measure an intermediate potential difference among the magneto resistive elements, and then, a −x-direction bias is applied by the same bias coil 101 to the magneto resistive elements to measure the intermediate potential difference among the magneto resistive elements. A difference between the intermediate potential differences measured when the +x-direction bias is applied and when the −x-direction bias is applied is proportional to sin θ, the angle θ being an angle between the horizontal component of the earth magnetism and the x-axis.

Next, a +y-direction bias is applied by the other bias coil 102 (referred to as a y-direction coil) to the four magneto resistive elements 91, 92, 93, and 94 constituting the MR bridge to measure an intermediate potential difference among the magneto resistive elements, and then, a −y-direction bias is applied by the same bias coil 102 to the magneto resistive elements to measure the intermediate potential difference among the magneto resistive elements. A difference between the intermediate potential differences measured when the +y-direction bias is applied and when the −y-direction bias is applied is proportional to sin(π/2−θ), that is, cos θ.

From the y-directional output Vy and the x-directional output Vx, the bearings can be measured as the direction θ of the horizontal component of the earth magnetism as follows:

$$\theta = \tan^{-1}(Vx/Vy).$$

However, the relationship between the magnetic field applied to the magneto resistive element and the resistance practically involves a hysteresis as shown in FIG. 24, rather than FIG. 20. When the applied magnetic field strength H is increased, it reaches a level of saturation via the upper curve in FIG. 24, and when it is decreased from the level, it traces the lower curve.

Therefore, when measuring bearings, the saturation magnetic field is applied before the application of the biasing magnetic field in consideration of the hysteresis.

For example, as disclosed in Japanese Patent Laid-Open No. 5-157565, when measuring bearings using the azimuth meter composed of the magneto resistive elements and two orthogonal bias coils as described above, the saturation magnetic field Hk is applied in +x direction, and then the intermediate potential difference between the magneto resistive elements is measured while applying the +x-direction biasing magnetic field Hb. Then, the saturation magnetic field −Hk is applied in −x direction by the same bias coil, and then the intermediate potential difference between the magneto resistive elements is measured while applying the −x-direction biasing magnetic field −Hb. The difference between the intermediate potential differences at the time of applications of the +x-direction bias and the −x-direction bias thus obtained is defined as an x-direction output Vx.

Then, the saturation magnetic field is applied in the +y direction by the other bias coil, and then the intermediate potential difference between the magneto resistive elements is measured while applying the +y-direction biasing magnetic field. Then, the saturation magnetic field is applied in the −y direction by the same bias coil, and then the intermediate potential difference between the magneto resistive elements is measured while applying the −y-direction biasing magnetic field. The difference between the intermediate potential differences at the time of applications of the +y-direction bias and the −y-direction bias thus obtained is defined as an y-direction output Vy. Based on the Vx and Vy, bearings are measured in the manner as described above.

The orthogonal four magneto resistive elements assembled into the MR bridge described above may be formed as zigzag magneto resistive elements formed by etching a Ni-based alloy film deposited on a ceramic substrate. Thus, the magneto resistive elements can be quite small and thin. However, since the two bias coil wound around them in x direction and y direction are provided outside the magneto resistive element bridge, the azimuth meter has, at the smallest, a thickness of the order of 3 mm and an area of the order of 10 mm×10 mm.

In the procedure of measuring bearings explained in the above description, it is required to carry out measuring four times because the bias is applied in +x direction and −x direction by the x-direction coil, the bias is applied in +y direction and −y direction by the y-direction coil, and then calculation is carried out.

Furthermore, in order to eliminate the effect of the hysteresis, before the biasing magnetic field is applied, the saturation magnetic field of the same direction as that of the biasing magnetic field is applied. After the application of the saturation magnetic field, application of the biasing magnetic field of the same direction tends to make the gradient of the curve for the resistance of the magneto resistive element, and the magnetic field be decreased, so that the output to be measured becomes low.

DISCLOSURE OF THE INVENTION

An object of the present invention is to provide an azimuth meter or a bearing sensor of a significantly reduced thickness and area.

Furthermore, another object of the present invention is to provide an azimuth meter or a bearing sensor in which the number of applications of a current to a coil and the number of measurements are less than before.

For example, an azimuth meter according to the invention comprises: a plane coil wound into a rectangular shape; and at least two groups of thin film magneto resistive elements disposed substantially parallel to the plane of the plane coil, in which each of said groups of magneto resistive elements constitutes an MR bridge of an even number of magneto resistive elements electrically connected to each other and detects and outputs two perpendicular components of the earth magnetism, and bearing information is obtained based on the output values, wherein the azimuth meter further comprises: means of passing a current in a predetermined direction through the plane coil to apply thereto a magnetic field that is equal to or higher than a saturation magnetization of said magneto resistive elements, applying a constant biasing magnetic field in the direction opposite to the direction, applying a magnetic field equal to or higher than the saturation magnetization of the magneto resistive elements in the direction opposite to said predetermined direction, and then applying a biasing magnetic field in the direction opposite to the latter direction; and means of passing a magnetic field measuring current through the groups of the thin film magneto resistive elements concurrently with the applications of said biasing magnetic fields.

Preferably, a circuit is arranged so that, when one power supply is used to apply the magnetic field equal to or higher than the saturation magnetization of the magneto resistive elements, a discharge voltage of a capacitor having been previously charged by a shunt current from the power supply is superimposed to the voltage applied to the plane coil.

Preferably, an angle $\beta$ formed between a longitudinal direction of each magneto resistive element and a side of the plane coil in the vicinity of the magneto resistive element satisfies a relation of sin $\beta \times$ cos $\beta \neq 0$, and an applied magnetic field characteristic in the vicinity of a region where the electrical resistance variation of the magneto resistive element in response to the applied magnetic field is the minimum is used.

Preferably, one of the groups of thin film magneto resistive elements is constituted by two pairs of magneto resistive elements, the magneto resistive elements in each pair being disposed intersecting opposite sides of said rectangular coil and being electrically connected to each other, the other of the groups of thin film magneto resistive elements is constituted by two pairs of magneto resistive elements, the magneto resistive elements in each pair being disposed intersecting opposite sides, different from said sides, of said rectangular coil and being electrically connected to each other, and the longitudinal directions of two magneto resistive elements disposed on a same side are substantially perpendicular to each other.

Preferably, the angle $\beta$ is any of about 45 degrees, about 135 degrees, about 225 degrees and about 315 degrees. Preferably, the variation of the angle at which the longitudinal direction of each magneto resistive element intersects the side of the rectangular coil falls within a range of ±5 degrees. If necessary, in the case where the two perpendicular components of the earth magnetism are detected by each of the groups of magneto resistive elements and output therefrom, and the bearing information is obtained based on the output values, a circuit may be additionally provided which outputs a difference between an output obtained when a bias is applied in a positive direction and an output obtained when a bias is applied in a negative direction.

A procedure of passing a current through the plane coil in a predetermined direction to apply thereto a magnetic field that is equal to or higher than a saturation magnetization of said magneto resistive elements, applying a constant biasing magnetic field in the opposite direction, and then measuring the resulting magnetic field to obtain an output value and a procedure of applying a magnetic field equal to or higher than the saturation magnetization of the magneto resistive elements in the direction opposite to said predetermined direction, applying a biasing magnetic field in the opposite direction, and then measuring the resulting magnetic field to obtain an output value may be performed two or more times, and the bearing information may be obtained based on the output values.

In the azimuth meter according to the invention, an even number of magneto resistive elements are electrically connected to each other to constitute an MR bridge. For example, in the "MR bridge" in the invention, magneto resistive elements A and B are disposed on opposite sides of a plane coil wound in a rectangular shape and connected in series, a magneto resistive element C perpendicular to the magneto resistive element A is disposed on the same side as the magneto resistive element A, a magneto resistive element D perpendicular to the magneto resistive element B is disposed on the same side as the magneto resistive element B, and the magneto resistive elements C and D are connected in series. And, the bridge is arranged to output a potential difference between an output V1 at the midpoint between the magneto resistive elements A and B and an output V2 at the midpoint between the magneto resistive elements C and D. According to the invention, two generally perpendicular components of the earth magnetism are detected by each of the groups of magneto resistive elements, and the bearing information is obtained based on the outputs thereof. This can reduce the effect of a hysteresis of an applied magnetic field on a resistance, eliminate the noise in the output and increase the absolute value of the output.

BEST MODE FOR CARRYING OUT THE INVENTION

Figure 1:
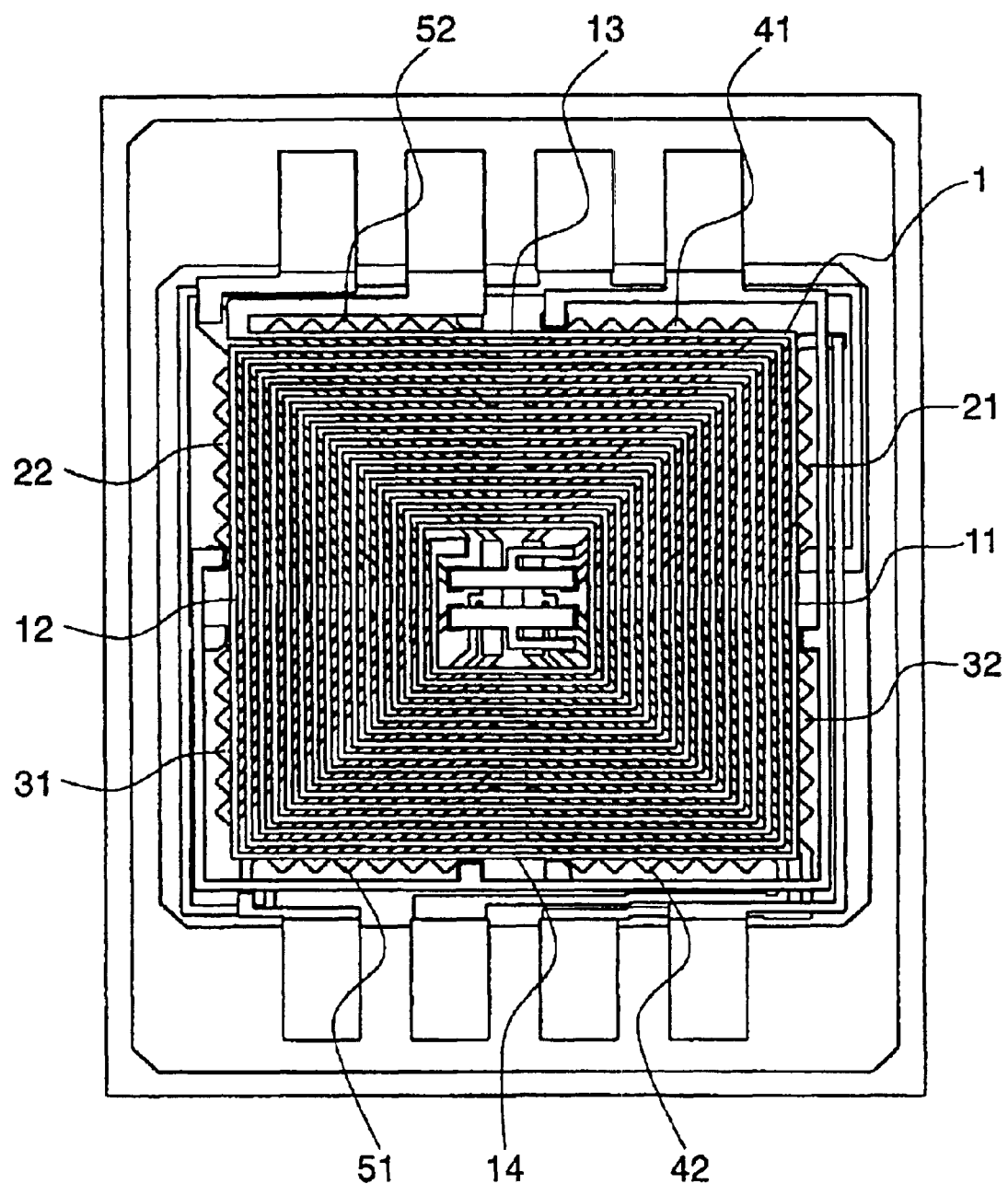
FIG. 1 is a schematic plan view of EXAMPLE of the invention.

FIG. 1 shows a plan view of an azimuth meter of EXAMPLE of the invention. In FIG. 1, reference numeral 1 denotes a tetragonal plane coil consisting of several tens of turns. On the same side of the plane coil, under the plane coil in this drawing, four pairs of magneto resistive element pairs 2, 3, 4, and 5 are provided in a plane parallel to the plane coil. The magneto resistive element pairs 2, 3, 4, and 5 are constituted by two magneto resistive elements 21 and 22, 31 and 32, 41 and 42, and 51 and 52, respectively.

The longitudinal direction of the magneto resistive element 21, which is one of the magneto resistive element pair 2, crosses only a side 11 of the plane coil 1 at an angle of about 45 degrees. The longitudinal direction of the magneto resistive element 22, which is the other of the magneto resistive element pair 2, crosses only the opposed side, that is, a side 12 of the plane coil 1 at an angle of about 45 degrees. The longitudinal direction of the magneto resistive element 21 is substantially perpendicular to the longitudinal direction of the magneto resistive element 22, and each of these magneto resistive elements 21 and 22 is connected to the other at one terminal thereof (a terminal on the inner side of the plane coil 1 in this EXAMPLE). Similarly, as for the other magneto resistive element pairs 3, 4, and 5, the longitudinal directions of the magneto resistive elements 31, 41, and 51 cross only the sides 12, 13, and 14, respectively, each of which is one side of the plane coil 1, and the longitudinal directions of the magneto resistive elements 32, 42, and 52 cross only the opposed sides 11, 14, and 13 of the plane coil 1, respectively, at an angle of about 45 degrees. In addition, the longitudinal directions of the magneto resistive elements 31, 41, and 51 are perpendicular to the longitudinal directions of their respective associated magneto resistive elements 32, 42, and 52. And, each of the magneto resistive elements 31 and 32 is connected to the other at one terminal thereof (a terminal on the inner side of the plane coil 1 in this EXAMPLE), each of the magneto resistive elements 41 and 42 is connected to the other at one terminal thereof (a terminal on the inner side of the plane coil 1 in this EXAMPLE), and each of the magneto resistive elements 51 and 52 is connected to the other at one terminal thereof (a terminal on the inner side of the plane coil 1 in this EXAMPLE). Furthermore, the longitudinal directions of the two magneto resistive elements 21 and 32 both crossing the side 11 of the plane coil 1 are perpendicular to each other. Similarly, the longitudinal directions of the two magneto resistive elements 22 and 31 both crossing the side 12, the longitudinal directions of the two magneto resistive elements 41 and 52 both crossing the side 13, and the longitudinal directions of the two magneto resistive elements 42 and 51 both crossing the side 14 are perpendicular to one another.

In this azimuth meter, the magneto resistive elements are provided on a substrate and further the plane coil is provided. The substrate is 0.7 mm thick. The thin film portion including the magneto resistive elements and plane coil disposed on the substrate is 40 to 50 micrometers thick. The substrate has a size of 3 mm×4 mm.

Figure 2:
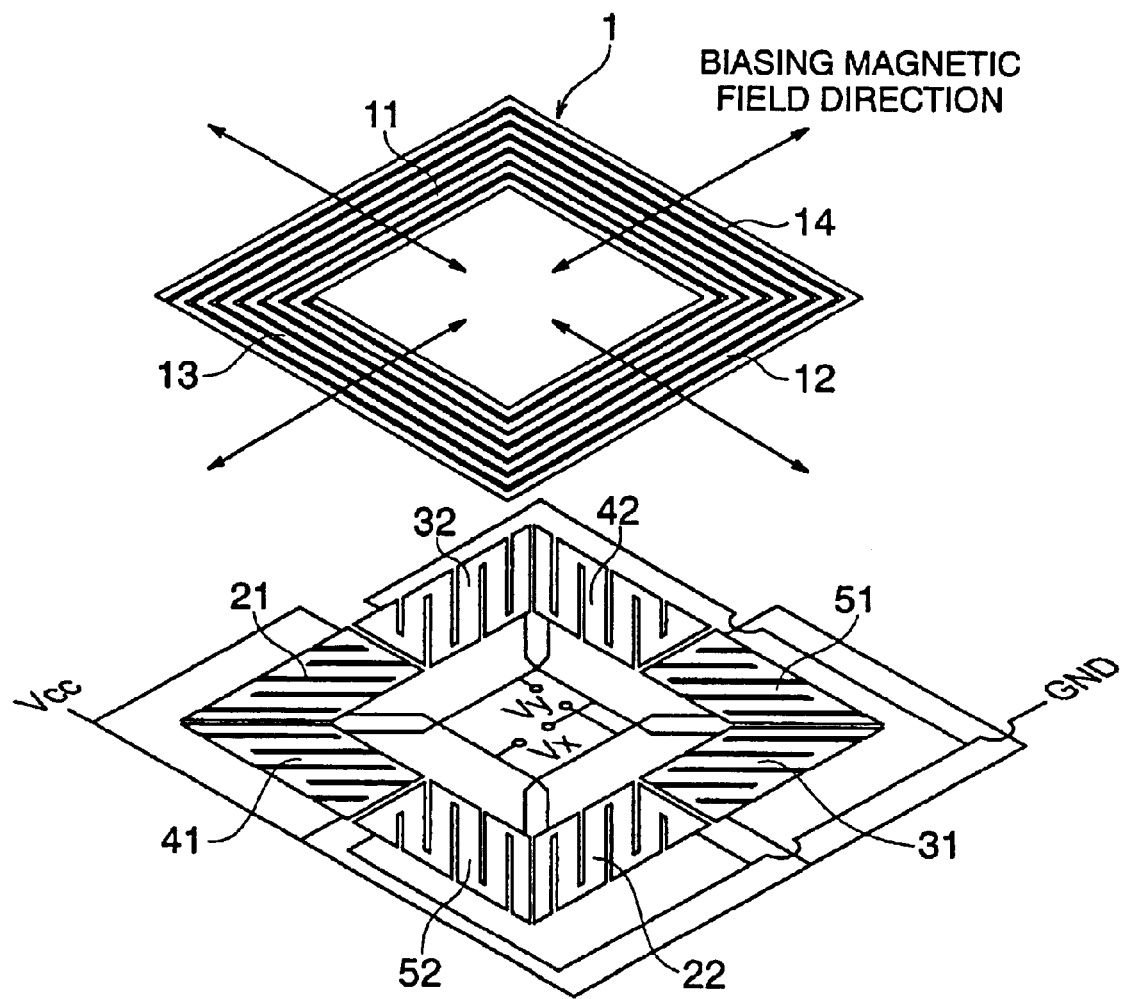
FIG. 2 is an exploded perspective view of EXAMPLE of the invention.
Figure 3:
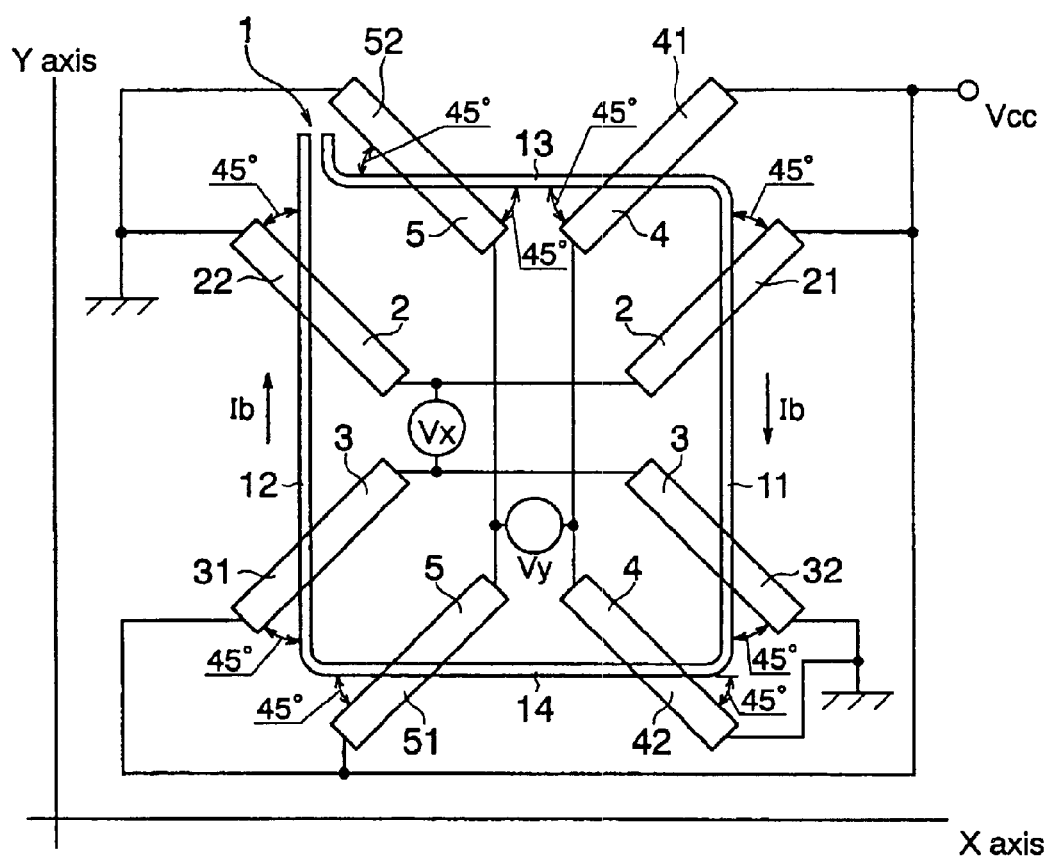
FIG. 3 is an example of a circuit diagram of magneto resistive elements suitable for EXAMPLE of the invention.
Figure 6:
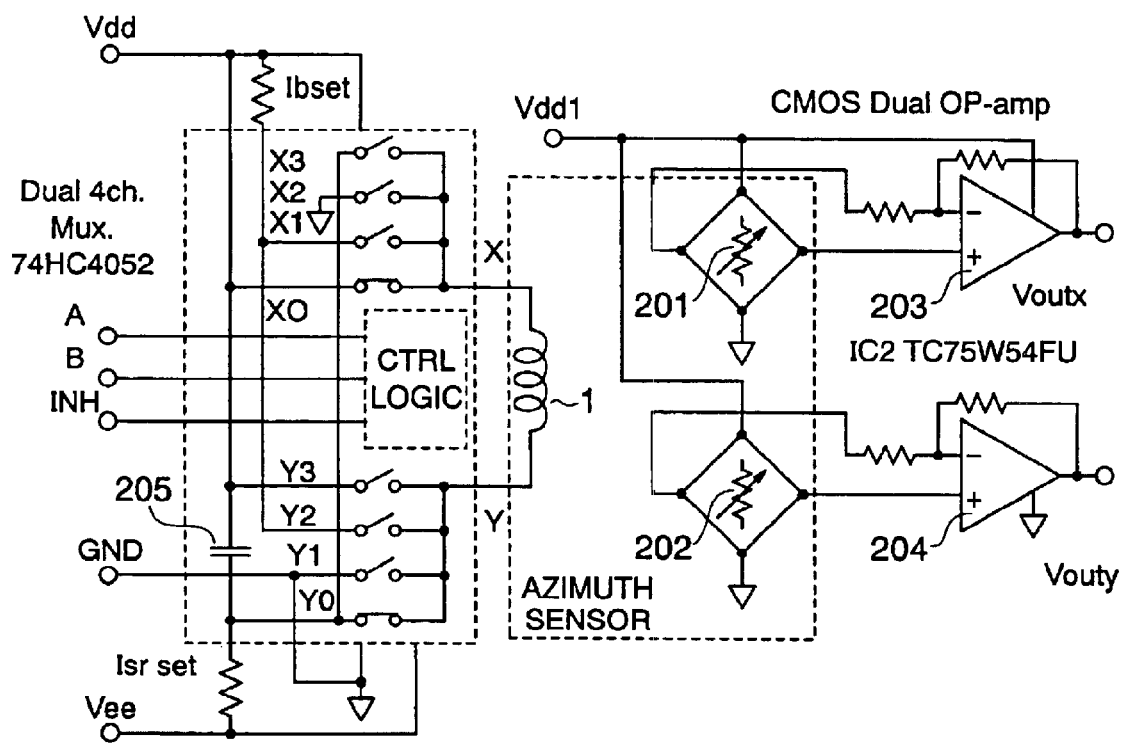
FIG. 6 is an explanatory circuit diagram for driving the azimuth meter according to the invention.

For a better understanding of EXAMPLE of the azimuth meter shown in FIG. 1, FIG. 2 is a schematic exploded perspective view thereof, FIG. 3 is a circuit diagram thereof, and FIG. 6 is an explanatory circuit diagram for driving the azimuth meter according to the invention. As seen from FIG. 2, when a direct current is passed through the plane coil 1, a DC magnetic field is generated in a direction from the inside to the outside of the coil or vice versa in a plane parallel to the plane coil, so that the DC magnetic field is applied to the magneto resistive element pairs. With reference to FIG. 3, when a current Ib passes through the plane coil 1 in a clockwise direction, a magnetic field in x direction is applied to the magneto resistive elements 21 and 32, a magnetic field in the −x direction is applied to the magneto resistive elements 22 and 31, a magnetic field in the y direction is applied to the magneto resistive elements 41 and 52, and a magnetic field in the −y direction is applied to the magneto resistive elements 42 and 51. If a current −Ib passes through the plane coil 1 in the opposite direction, a magnetic field in the opposite direction is applied to each of the magneto resistive elements. That is, the four magneto resistive elements 21, 22, 31 and 32 constitute an MR bridge, while the four magneto resistive elements 41, 42, 51 and 52 constitute another MR bridge.

Figure 20:
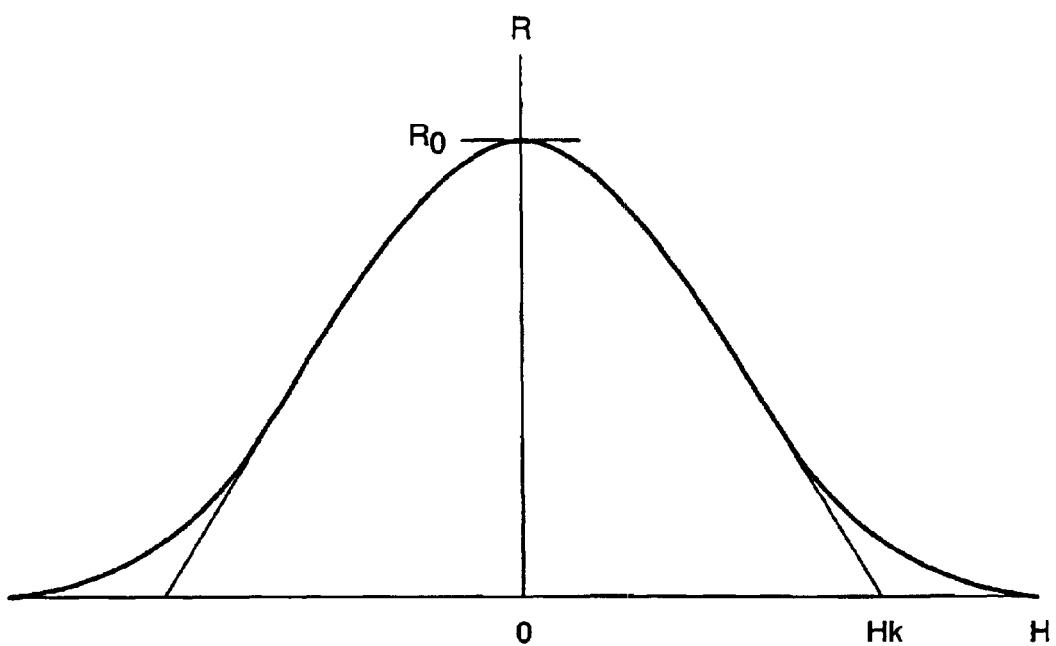
FIG. 20 is a typical graph explaining a relationship between an electric resistance and an applied magnetic field strength.
Figure 21:
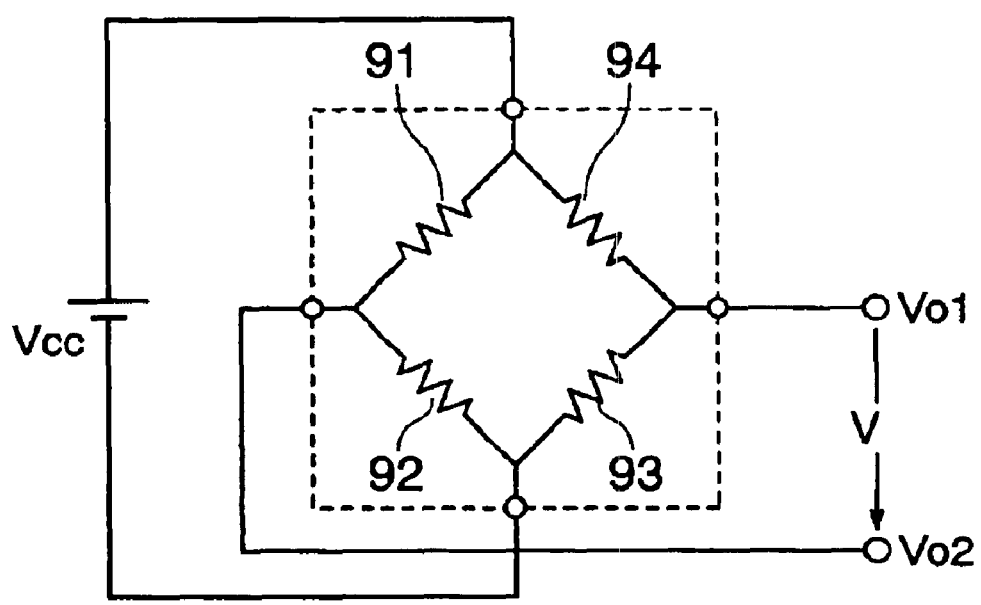
FIG. 21 is an explanatory circuit diagram of an MR bridge for a typical azimuth meter.
Figure 22:
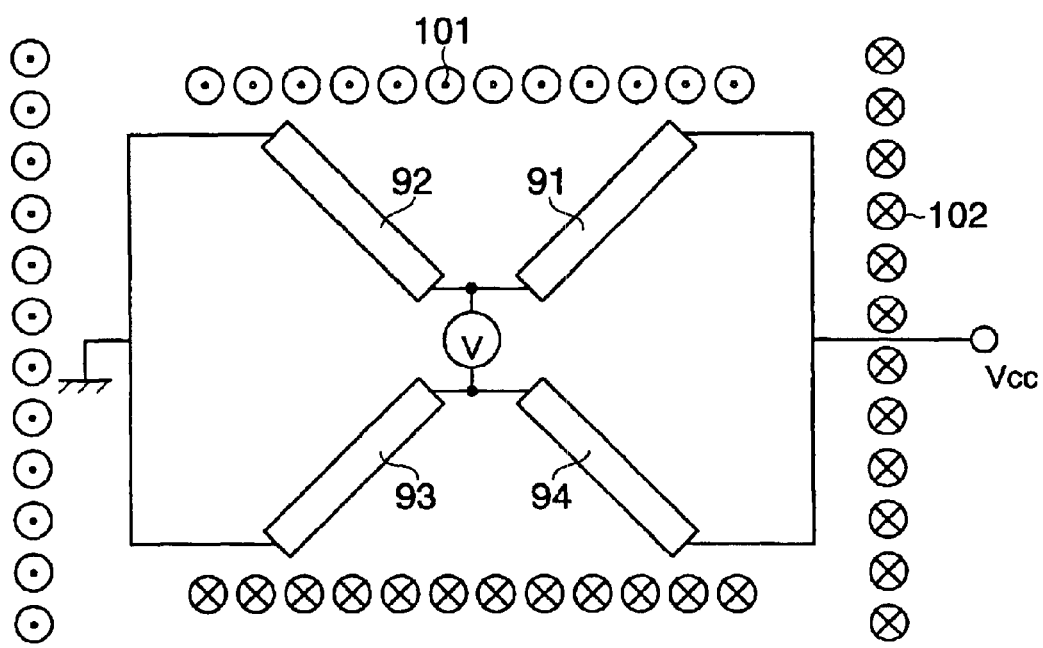
FIG. 22 is a schematic cross-sectional view of the MR bridge for the conventional azimuth meter.
Figure 23:
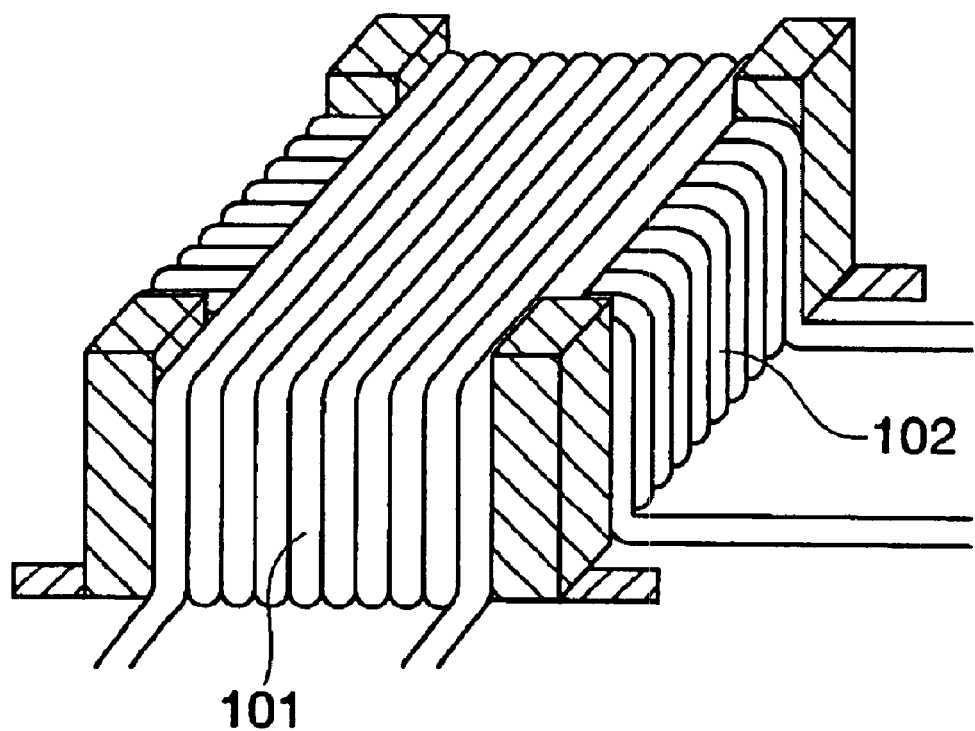
FIG. 23 is a perspective view of the conventional azimuth meter.
Figure 24:
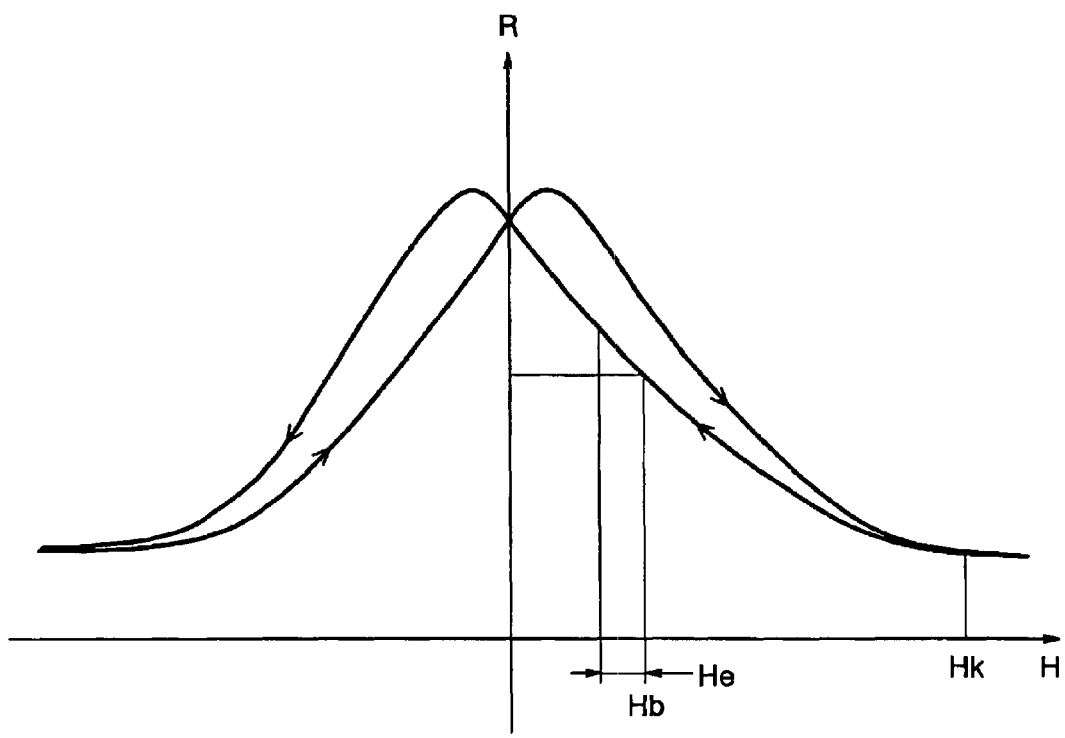
FIG. 24 is a graph showing a hysteresis involved in the relationship between the electric resistance and the applied magnetic field strength.

If, when a current is passed through a magneto resistive element in the longitudinal direction, an when a magnetic field is applied in a direction perpendicular to the longitudinal direction in the magneto resistive element plane, the resistance of the magneto resistive element is decreased depending on the magnetic field strength as shown in FIG. 20 and causes a hysteresis depending on the direction of the applied magnetic field as shown in FIG. 24.

Figure 4:
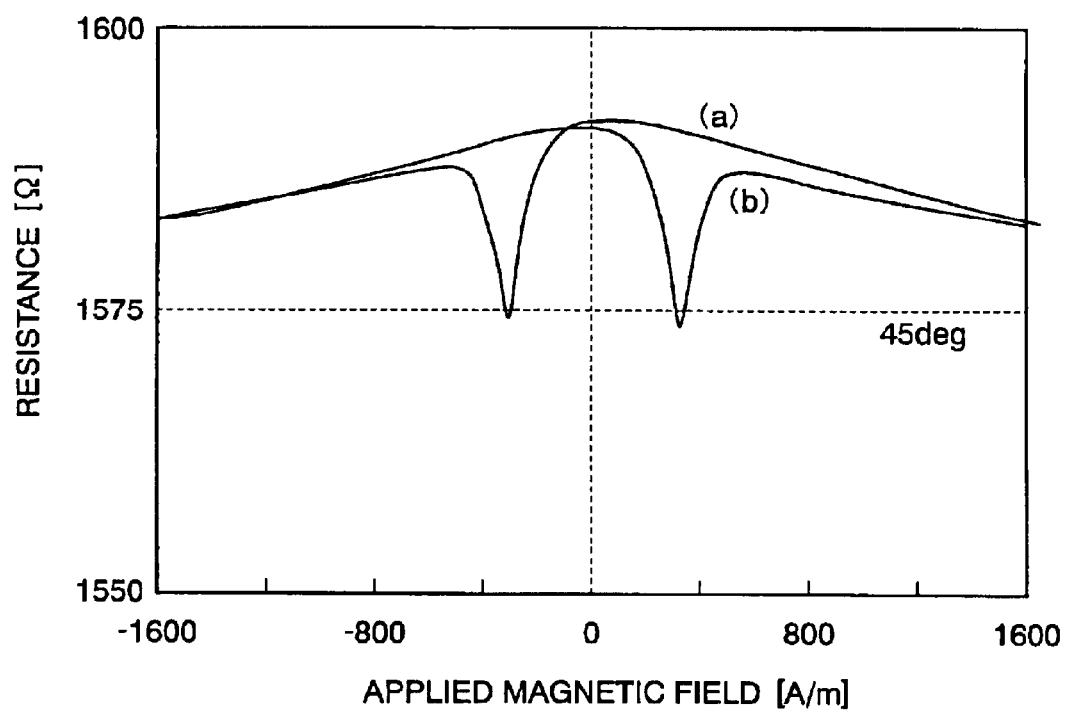
FIG. 4 is a graph showing a relationship between a resistance and an external magnetic field strength.

If the magneto resistive element crosses the side of the plane coil at an angle of 45 degrees as in the present invention, the external magnetic field is applied in a direction of 45 degrees with respect to a direction perpendicular to the longitudinal direction. At this time, the magneto resistive element has a shape magnetic anisotropy in the longitudinal direction, so that this situation can be considered to be equivalent to the situation in which a composite vector of the magnetic shape anisotropy magnetic field and the external magnetic field is applied thereto. Therefore, the relationship between the external magnetic field and the resistance when the external magnetic field is applied to the magneto resistive thin plate is represented by the graph shown in FIG. 4. FIG. 4 shows the variation (a) in the resistance in the case where while a strong magnetic field is applied in a positive direction, the strength of the applied magnetic field is gradually reduced, and the reversal variation (b). Since the resistance has the minimum value while the applied magnetic field is negative, when a negative magnetic field of a predetermined strength is applied after a positive strong magnetic field is applied and reduced, the variation ratio of the resistance with respect to the variation in the applied magnetic field becomes the largest. In the case where while the strong magnetic field is applied in the negative direction and the applied magnetic field is gradually increased, the variation ratio of the resistance with respect to the variation in the applied magnetic field becomes the largest when a positive magnetic field of a predetermined strength is applied.

Therefore, in the present invention, when measuring bearings by using the azimuth meter of EXAMPLE shown in FIGS. 1 through 3, a direct current is passed through the plane coil 1 in the clockwise direction in FIG. 3 to apply to the magneto resistive elements 21 to 52 a DC magnetic field enough to saturate a magnetic field of each of the magneto resistive elements 21 to 52 in the direction perpendicular to the longitudinal direction, and a direct current of a predetermined strength is passed through the plane coil 1 in the opposite direction (counterclockwise direction in FIG. 3) to apply to the magneto resistive elements a biasing DC magnetic field in a direction perpendicular to the longitudinal direction, and during the application of the biasing DC magnetic field, a voltage Vcc for measuring bearings is applied between the other terminals of the magneto resistive elements of the magneto resistive element pairs to take out an intermediate potential from the connected terminals of the magneto resistive element pairs. When the direct current is passed in the clockwise direction in FIG. 3 to apply to the magneto resistive elements 21 to 52 the DC magnetic field enough to saturate the magnetic field of each of the magneto resistive elements 21 to 52 in the direction perpendicular to the longitudinal direction, all of the magneto resistive elements enter a state shown in the right end of FIG. 4. The direct current is reduced or turned off, and a DC magnetic field caused by a direct current of a predetermined strength in a direction opposite to the direct current, in particular, counterclockwise direction in FIG. 3, that is, a magnetic field of a magnitude at which the variation ratio of the resistance with respect to the applied magnetic field approaches its maximum value is applied to take out an intermediate potential from the connected terminals of the magneto resistive elements. Now, it is assumed that the magnitude of the horizontal component of the earth magnetism is denoted by He, and the angle of the horizontal component of the earth magnetism He with respect to x axis is denoted by $\theta$. Then, the intermediate potential output of the magneto resistive elements 21 and 22 is represented by:

$$Vcc \cdot (\frac{1}{2} - 1/(2 \cdot Rb) \cdot \beta He \cos \theta),$$

where reference symbol $\beta$ denotes a variation ratio of the resistance with respect to a magnetic field, and reference symbol Rb denotes a resistance of the magneto resistive element at the time when only the biasing magnetic field Hb is applied.

In this EXAMPLE, since the difference between the intermediate potential outputs of the connected terminals of the magneto resistive element pairs 2 and 3 is taken out as Vx in FIG. 3, the intermediate potential output difference Vx is represented by:

$$Vx(+) = Vcc \cdot ((\frac{1}{2} - 1/(2 \cdot Rb) \cdot \beta He \cos \theta) - (\frac{1}{2} + 1/(2 \cdot Rb) \cdot \beta He \cos \theta)) = -Vcc \cdot 1/Rb \cdot \beta He \cos \theta.$$

Similarly, since the difference between the intermediate potential outputs of the connected terminals of the magneto resistive element pairs 4 and 5 is taken out as Vy in FIG. 3, the intermediate potential output difference Vy is represented by:

$$Vy(+) = Vcc \cdot (\frac{1}{2} - 1/(2 \cdot Rb) \cdot \beta He \sin \theta) - (\frac{1}{2} + 1/(2 \cdot Rb) \cdot \beta He \sin \theta)) = -Vcc \cdot 1/Rb \cdot \beta He \sin \theta.$$

Next, a direct current is passed through the plane coil 1 in a direction opposite to that of the above description (counterclockwise direction in FIG. 3) to apply to the magneto resistive elements 21 to 52 a DC magnetic field enough to saturate a magnetic field of each of the magneto resistive elements 21 to 52 in the direction perpendicular to the longitudinal direction, and a direct current of a predetermined strength is passed through the plane coil 1 in a direction opposite to the former direct current (clockwise direction in FIG. 3) to apply to the magneto resistive elements a biasing DC magnetic field in the direction perpendicular to the longitudinal direction, and during the application of the biasing DC magnetic field, a voltage Vcc for measuring bearings is applied between the other terminals of the magneto resistive elements of the magneto resistive element pairs in the same manner as described above to take out an intermediate potential from the connected terminals. Provided that the absolute value of the magnitude of the applied magnetic field is substantially the same as that of the above description, the variation ratio of the resistance with respect to the applied magnetic field becomes maximum.

The difference between the intermediate potential outputs of the connected portions of the magneto resistive element pairs 2 and 3 is taken out as Vx in FIG. 3, the intermediate potential output difference Vx being represented by:

$$Vx(-) = Vcc \cdot 1/Rb \cdot \beta He \cos \theta.$$

And, the difference between the intermediate potential outputs of the connected terminals of the magneto resistive element pairs 4 and 5 is taken out as Vy in FIG. 3, the intermediate potential output difference Vy being represented by:

$$Vy(-) = Vcc \cdot 1/Rb \cdot \beta He \sin \theta.$$

The differences between the intermediate potential output differences in x direction and y direction are obtained as follows:

$$V \text{ in } x \text{ direction} = Vx(+) - Vx(-) = -2 \; Vcc \cdot 1/Rb \cdot \beta He \cos \theta;$$

$$V \text{ in } y \text{ direction} = Vy(+) - Vy(-) = -2 \; Vcc \cdot 1/Rb \cdot \beta He \sin \theta.$$

Therefore, the angle $\theta$ of the horizontal component of the earth magnetism with respect to x axis can be represented by:

$$\theta = \tan^{-1} (V \text{ in } y \text{ direction}/V \text{ in } x \text{ direction}).$$

As apparent from the above description, when a direct current is passed in one direction, the intermediate potential output differences at the time of applications of the biasing magnetic field to the magneto resistive element pairs 2, 3 and the magneto resistive element pairs 4, 5 in x direction and y direction, respectively, can be obtained simultaneously, and when a direct current is passed in the opposite direction, the intermediate potential output differences at the time of applications of the biasing magnetic field to the magneto resistive element pairs 2, 3 and the magneto resistive element pairs 4, 5 in −x direction and −y direction, respectively, can be obtained simultaneously.

While in the description of EXAMPLE, the angle at which the magneto resistive thin plates cross the respective sides of the plane coil is assumed to be π/4, that is, 45 degrees, bearings can be measured as far as the angle is more than 0 degree and not more than 60 degrees. However, when the angle is too small, the region in which the resistance varies according to the magnetic field is reduced in the vicinity of the minimum value in FIG. 4 so that it is difficult to establish an appropriate biasing magnetic field. Therefore, the most manageable angle is 45 degrees.

Furthermore, while in the above EXAMPLE, the cases has been described in which the longitudinal directions of the two magneto resistive elements crossing one side of the plane coil 1 are perpendicular to each other, and the longitudinal directions of the two magneto resistive elements of one magneto resistive element pair are perpendicular to each other, it is only needed that they are not parallel to each other. However, the most manageable angle thereof is a right angle. It is preferred that the angles at which the magneto resistive elements in one element pair cross the respective sides is in a mirror image relationship. As the relationship approximates the mirror image relationship, the output is less varied and approximates a sine wave. Therefore, in the magneto resistive element pair, the difference between the angles at which the magneto resistive elements cross the respective sides falls within the range of +/−5 degrees. More preferably, for all the magneto resistive elements in the azimuth meter, the variation in the angles at which the magneto resistive elements cross the respective sides falls within the range of +/−5 degrees.

As for the plane coil, when the plane coil having an outer diameter of 2 to 3 mm and the number of turns of 50 to 100 turns was manufactured, a sufficient output was obtained. The size of the coil is preferably as small as possible to minimize the power consumption.

The most effective way to generate a required magnetic field by a low power supply voltage is to reduce the resistance of the coil. The coil resistance depends on the thickness, width, and length, and the length dominantly depends on the size of the coil. While the width and thickness preferably are as large as possible, the thickness is defined by the space between the conductors. Within the restriction of the space between the conductors, the thickness is preferably large. In terms of manufacturing, however, it is not preferred that the plating thickness is too large. Therefore, the adequate thickness is 2 to 5 micrometers. Accordingly, the adequate width is 8 to 20 micrometers.

The distance between the plane coil and the magneto resistive element is preferably as small as possible because the magnetic field in the extreme vicinity of the plane coil is used in the present invention. It is suitable that the distance is on the order of 1.5 times the thickness of the magneto resistive element and wiring film in consideration of the insulating property of the insulating film disposed therebetween. The adequate distance is 0.5 to 2 micrometers.

In the EXAMPLES described above, the azimuth meter is of a two-layered type in which a magneto resistive element is provided on a substrate and a coil is disposed thereon. The number of the magneto resistive elements or the coils may be increased. For example, if a three-layered type is provided in which a magneto resistive element, a coil, and a magneto resistive element are disposed on a substrate sequentially, the output can be doubled. Alternatively, a three-layered type in which a coil, a magneto resistive element, and a coil are disposed on a substrate sequentially may be provided. In addition, the magneto resistive elements may be provided in a plurality of planes parallel to the plane in which the plane coil lies.

As a coil configuration, a plane coil of parallelogram, rectangle or cross can be used. Although the present invention has been explained by using the plane coil of the square shape in the above description, a plane coil of other shape can be used.

In the following, operations of a magneto resistive element and a driving circuit for the magneto resistive element will be described in more detail.

As described above, FIG. 4 is a graph showing a resistance of a magneto resistive element and an applied magnetic field at the time when the direction of a current forms an angle of 45 degrees with the direction of the applied magnetic field. In the present invention, the characteristic shown in this drawing is adopted.

Figure 5:
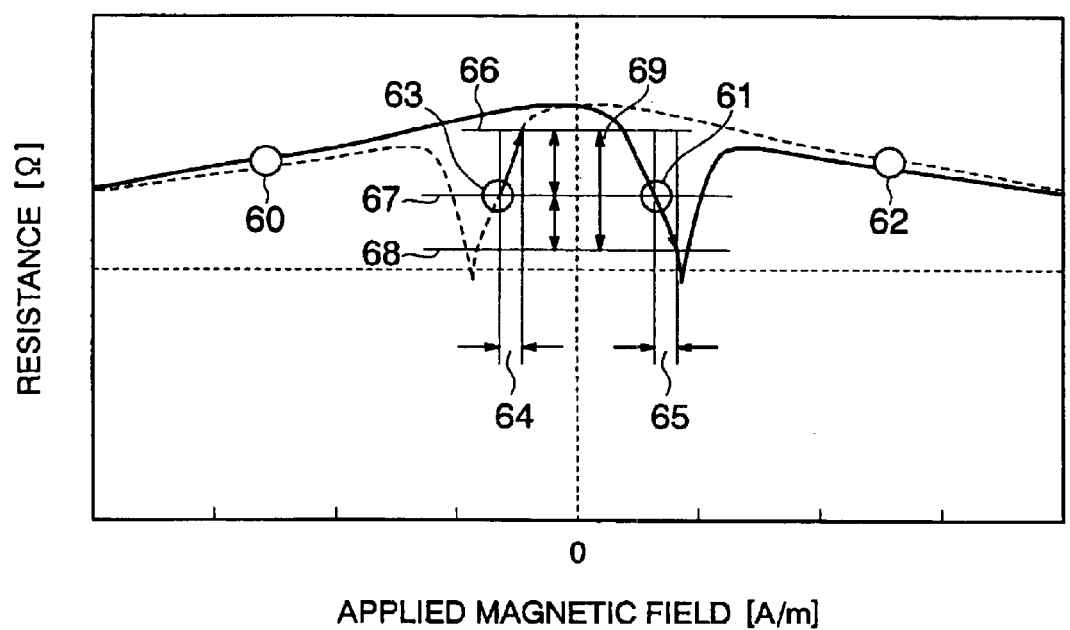
FIG. 5 is an explanatory view of operation of magneto resistive elements according to the invention.

FIG. 5 is an explanatory view of operation of a magneto resistive element according to the invention. At operating points denoted by reference numerals 61 and 62, the gradients of the curve with respect to the applied magnetic field, that is, the sensitivities, are larger than the gradient of the curve shown in FIG. 20. Therefore, applying the magnetic field at an angle of 45 degrees with respect to the longitudinal direction of the element (direction of the current in the element) can provide a high sensitivity. Operations at the points denoted by reference numerals are as follows.

A) Reference numeral 60 denotes a point where a magnetic field equal to or higher than the saturation magnetization Hk is applied in the negative direction. At this point, the magnetic domain of the magneto resistive element is aligned in one direction.

B) Reference numeral 61 denotes a point where a bias is applied in the positive direction. When there is no external magnetic field, the resistance is the value indicated by reference numeral 67, and when there is an external magnetic field 65, the resistance is the value indicated by reference numeral 68.

C) Reference numeral 62 denotes a point where a magnetic field equal to or higher than the saturation magnetization Hk is applied in the positive direction. The magnetic domain of the magneto resistive element is aligned in the direction opposite to that for the point 60.

D) Reference numeral 63 denotes a point where a bias is applied in the negative direction. When there is an external magnetic field 64 (which is the same as the external magnetic field 65 in direction and magnitude), the resistance is the value indicated by reference numeral 66.

With respect to the resistance value 67 obtained when there is no external magnetic field, the resistance changes between the values 66 and 68. This difference is denoted by a resistance value 69. Two of four magneto resistive elements connected in an MR-bridge configuration operate in this manner. The remaining two are disposed in the opposite direction with respect to the external magnetic field and can provide signals having the opposite sign to the resistance value 69 and the same magnitude as the resistance value 69.

Figure 7:
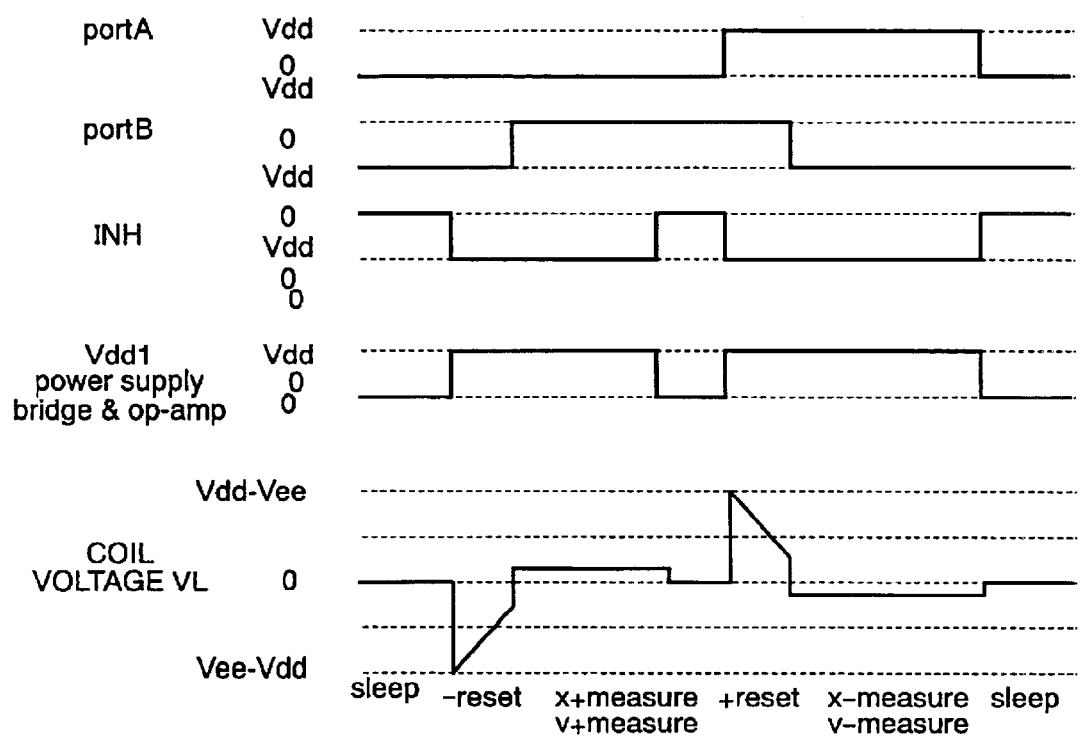
FIG. 7 is a timing chart of driving of the azimuth meter of the invention.

FIG. 6 shows an example of the driving circuit used in the invention. The rhombuses denote MR bridge circuits 201 and 202 constituted by four magneto resistive elements. Outputs thereof are amplified by CMOS operational amplifiers 203 and 204 about by a factor of 100. Given that a current passing through a plane coil 1 in a direction from a multiplexer Y terminal to a multiplexer X terminal is a positive current, FIG. 6 is associated with the timing chart shown in FIG. 7.

A) In FIG. 6, a capacitor 205 in the left frame is charged via a resistance (Isr set) by a sum voltage which is a sum of the absolute value of the magnitude of a voltage Vdd (positive) and the absolute value of the magnitude of a voltage Vee (negative). Ports A and B are kept at the low level. If a port INH is turned to the low level, the multiplexer X terminal and the multiplexer Y terminal are connected to terminals X0 and Y0, respectively, and a pulse current passes through the coil 1 in the direction from the X terminal to the Y terminal.

B) If the port B is turned to the high level, the multiplexer X terminal and the multiplexer Y terminal are connected to terminals X2 and Y2, respectively, and a current passes through the coil 1 in a direction from the Y terminal to the X terminal. At this time, the outputs of the two MR bridges 201 and 202 are extracted. The port INH is turned to the high level to switch off the bias current. During this process, the capacitor C205 is re-charged.

C) The port A is turned to the high level. Then, if the port INH is turned to the low level, a pulse current passes through the coil 1 in a direction from an X3 terminal to a Y3 terminal.

D) If the port B is turned to the low level, the terminals X1 and Y1 are connected to each other, and therefore, a current flows in the negative direction. The outputs of the two MR bridge are extracted again. Then, the port INH is turned to the high level to switch off the coil current.

Figure 8:
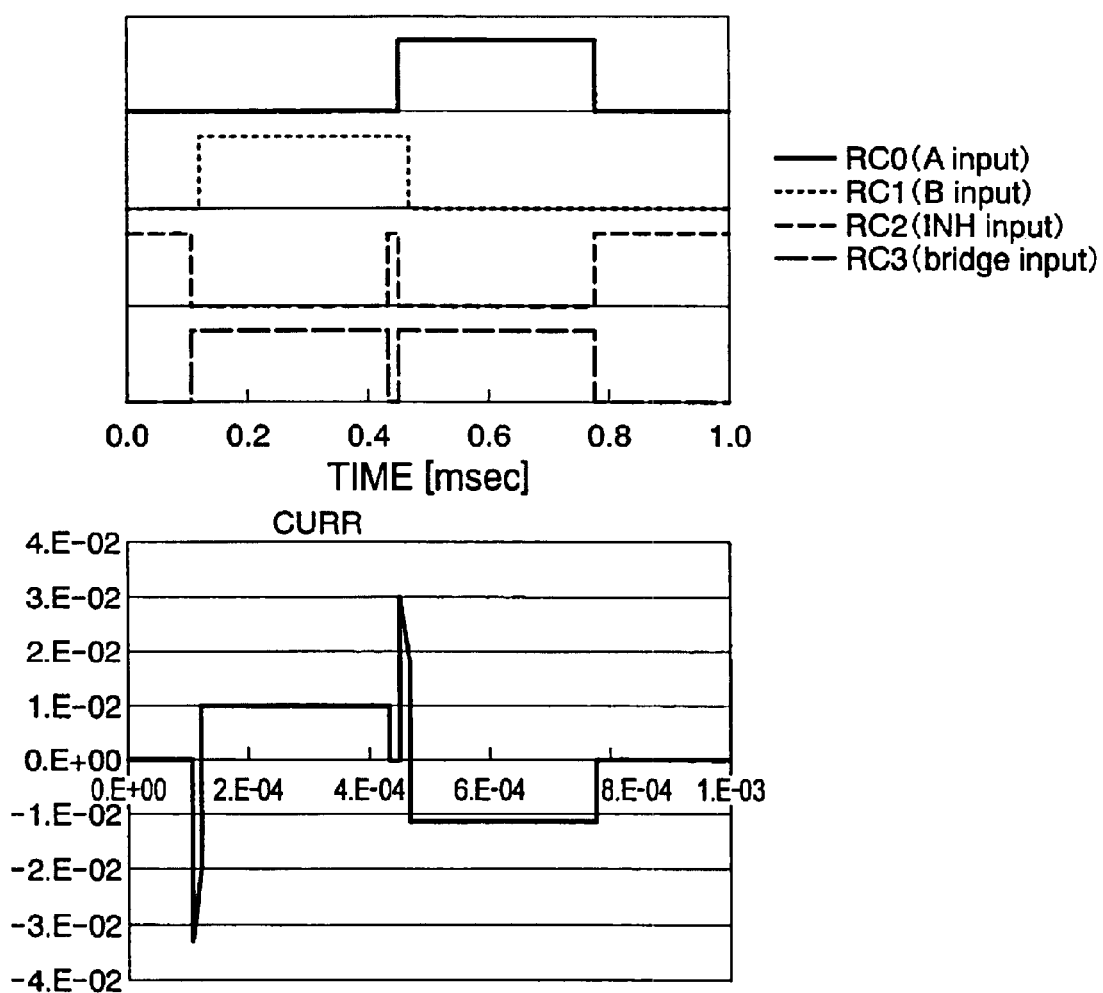
FIG. 8 is graphs showing voltage wave and coil current wave of the driving circuit for the azimuth meter of the invention.
Figure 9:
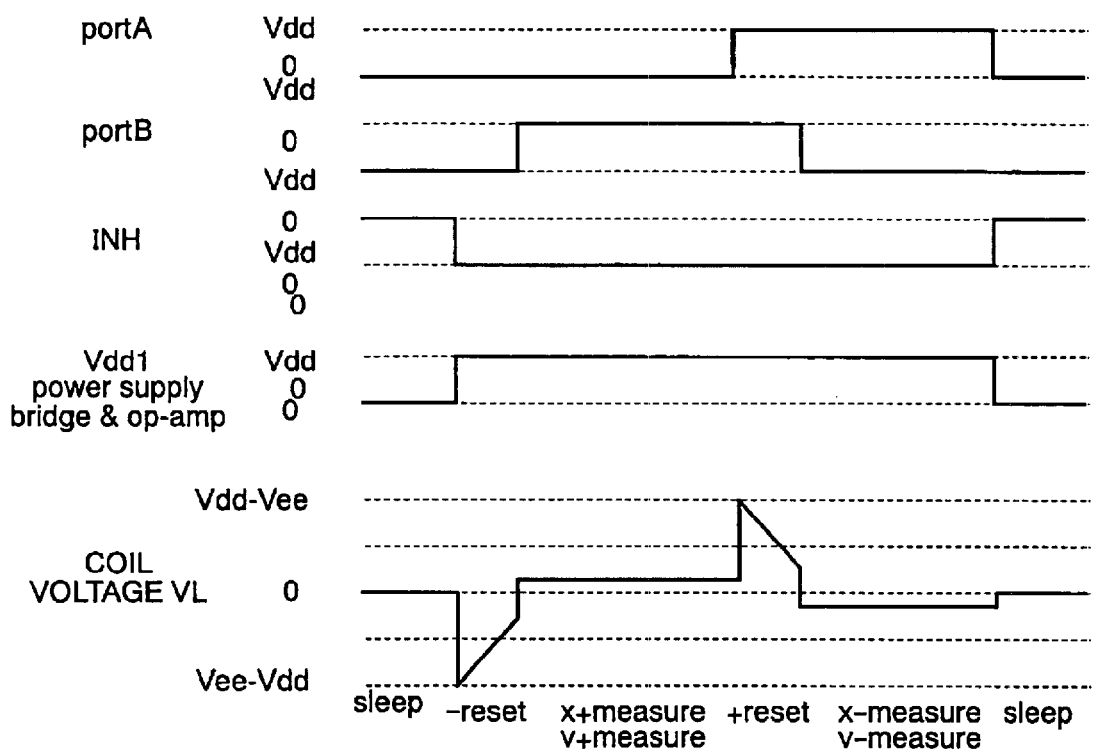
FIG. 9 is a timing chart of driving of the azimuth meter of the invention.

Subtraction of the values obtained in the two measurements allows measurement of the magnetic field in each direction. FIG. 8 shows a voltage waveform and a coil current waveform for an actual circuit. The same operation can be attained if the midway operation is omitted. A timing chart in such a case is shown in FIG. 9.

Figure 10:
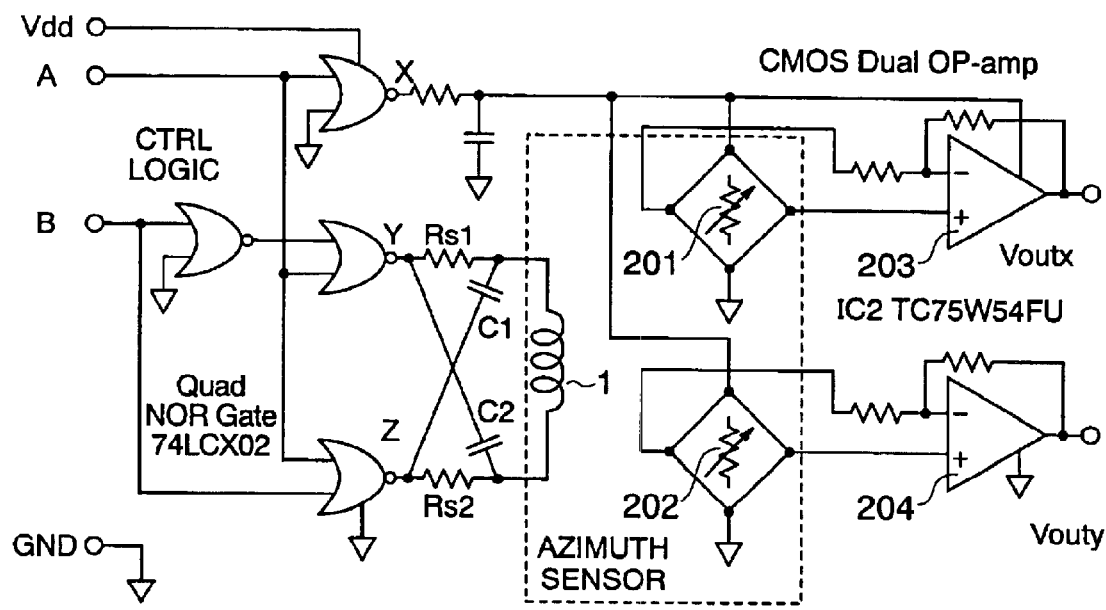
FIG. 10 is another circuit diagram for driving the azimuth meter according to the invention.
Figure 11:
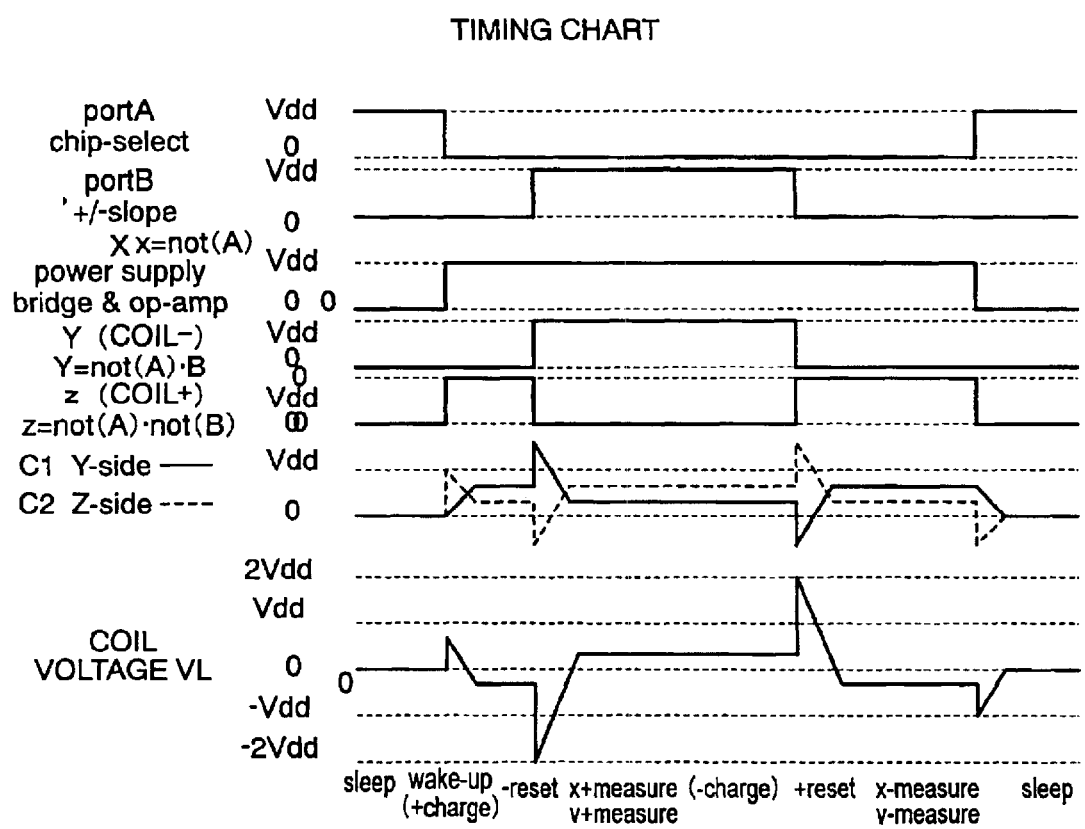
FIG. 11 is a timing chart of driving of the azimuth meter of the invention.

Because of the high coil resistance, in the circuit shown in FIG. 6, the power supply voltage is not enough to provide a sufficient reset current, and thus, another power supply of the opposite polarity is needed. FIG. 10 shows a circuit improved to address the problem. While the arrangement following the MR bridges shown in FIG. 10 is the same as that shown in FIG. 6, the method of driving the coil is different from that for the circuit shown in FIG. 6. FIG. 11 shows a timing chart for explaining the operation thereof.

The circuit shown in FIG. 6 requires two power supplies Vdd and Vee. The circuit shown in FIG. 10 is improved in this regard. To unite the power supplies, the circuit is characterized in that a high voltage is obtained with a simple circuit arrangement by superimposing the voltages charged in the capacitors on the original voltage. The microcomputer is required to have two ports (A, B). While the port A is normally kept at the high level, it is turned to the low level when the sensor is used. The coil 1 is driven via four NOR gates (one IC), and the X terminal output serves as the ON/OFF output for power supply for the bridges 201, 202 and the operational amplifiers 203, 204. The manners of connection and operation are the same as in the circuit shown in FIG. 6. The input of the port B is kept at the low level. Then, the port A is also turned to the low level, thereby supplying electric power to the amplifiers and the bridges. The Y terminal side is turned to the low level and the Z terminal side is turned to the high level. From the Z terminal, a current flows through a resistor Rs2, the coil 1 and a resistor Rs1 to the Y terminal. Thus, a voltage is applied to the resistors Rs1, Rs2 and the coil 1. By this voltage, within several tens microseconds, the plate of a capacitor C1 on the side of the resistor Rs1 is charged negatively, and the plate of a capacitor C2 on the side of the resistor Rs2 is charged positively. Since the capacitors are provided in a cross (bridge) arrangement between the Y and Z outputs, the sum of the absolute values of the magnitudes of the voltages of the capacitors is equal to or slightly higher than the power supply voltage.

The input of the port B is turned to the high level. Then, the Y terminal output and the Z terminal output are both inverted. That is, the Y terminal is turned to the high level, and the Z terminal is turned to the low level. Thus, the plate of the capacitor C2 on the side of the resistor Rs2 connected to the Y terminal is additionally applied with the previously charged voltage, and thus, the capacitor C2 has a voltage about 1.5 times higher than the power supply voltage charged therein. On the other hand, the capacitor C1 connected to the Z terminal has a negative voltage about 0.5 times higher than the power supply voltage occurring therein. The coil 1 is applied with the differential voltage of the voltages, that is, a voltage about twice as high as the power supply voltage. As a result, the coil 1 can produce a sufficient magnetic field to provide a saturation magnetization of the magneto resistive elements. This state corresponds to the point 60 in FIG. 5. The capacitors completely discharge in about 2 $\mu$s, and then, a current flows through the coil in a direction from the Y terminal to the Z terminal. The value of the current is associated with the operating point 61 in FIG. 5, and is determined by the resistances of the resistors Rs1, Rs2 and the coil 1 and the power supply voltage. At this time, the capacitors C1 and C2 are charged in the direction opposite to that described above. During this process, the output voltages of the two MR bridges are amplified and measured. Once the measurement is completed, the input of the port B is turned to the low level. Then, the Y terminal is turned to the low level, and the Z terminal is turned to the high level. The charges in the capacitors, having been oppositely charged, produce a pulse current in the opposite direction. This state corresponds to the operating point 62 in FIG. 5. Once the discharge is completed, a current depending on the resistances of the resistors Rs1, Rs2 and the coil 1 flows through the coil 1 in a direction from the Z terminal to the Y terminal. Then, the operating point 63 is reached. At this time, the outputs of the two MR bridges 201, 202 are measured again. Once the measurement is completed, the port A is returned to the high level. Then, the circuit shown in FIG. 10 stops operating. After that, the differences between the two outputs for the magnetic fields in the two directions are determined, thereby providing measurements of the magnetic fields. Then, calculation is performed to provide a bearing indication.

Figure 12:
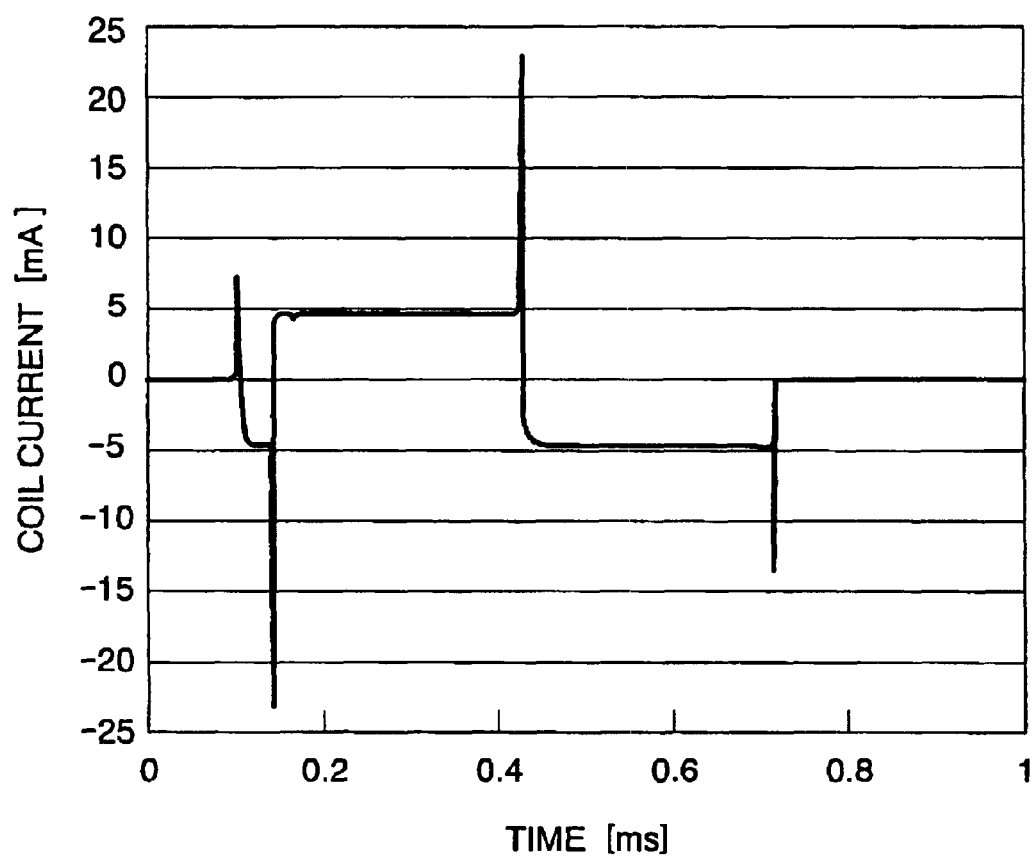
FIG. 12 is a graph showing measured coil current wave of the azimuth meter of the invention.
Figure 13:
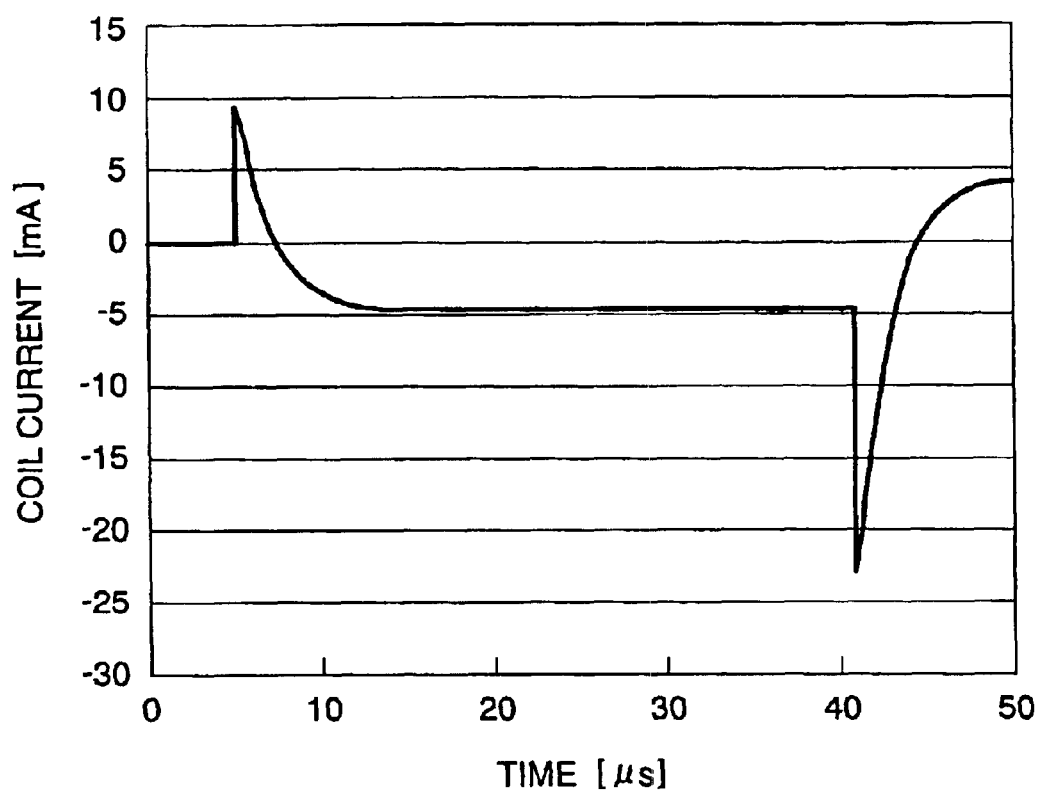
FIG. 13 is an enlarged graph showing measured coil current wave of the azimuth meter of the invention.

FIG. 12 shows measurements of an actual coil current. The significant positive and negative pulses correspond to the operating points 62 and 60 in FIG. 5. The flat positive and negative sections correspond to the operating points 61, 63. Here, amplified analog voltages are measured for each direction four times in total. FIG. 13 is an enlarged graph showing the initial part of the coil current. The significant negative pulse corresponds to the point 60 in FIG. 5. The coli resistance is 200 $\Omega$, the power supply voltage is 3 V, and a current of 23 mA is flows through the coil. The voltage applied to the coil is 4.6 V, which is higher than the power supply voltage. The pulse width can be changed by the capacitors C1 and C2. While a larger pulse width is more effective, a larger pulse width requires a longer time to discharge the IC output and consumes a higher current. Experimentally, an adequate result was provided when the capacitors C1 and C2 had a capacitance of 22000 pF and the capacitors discharging time was about 2 µs.

Figure 14:
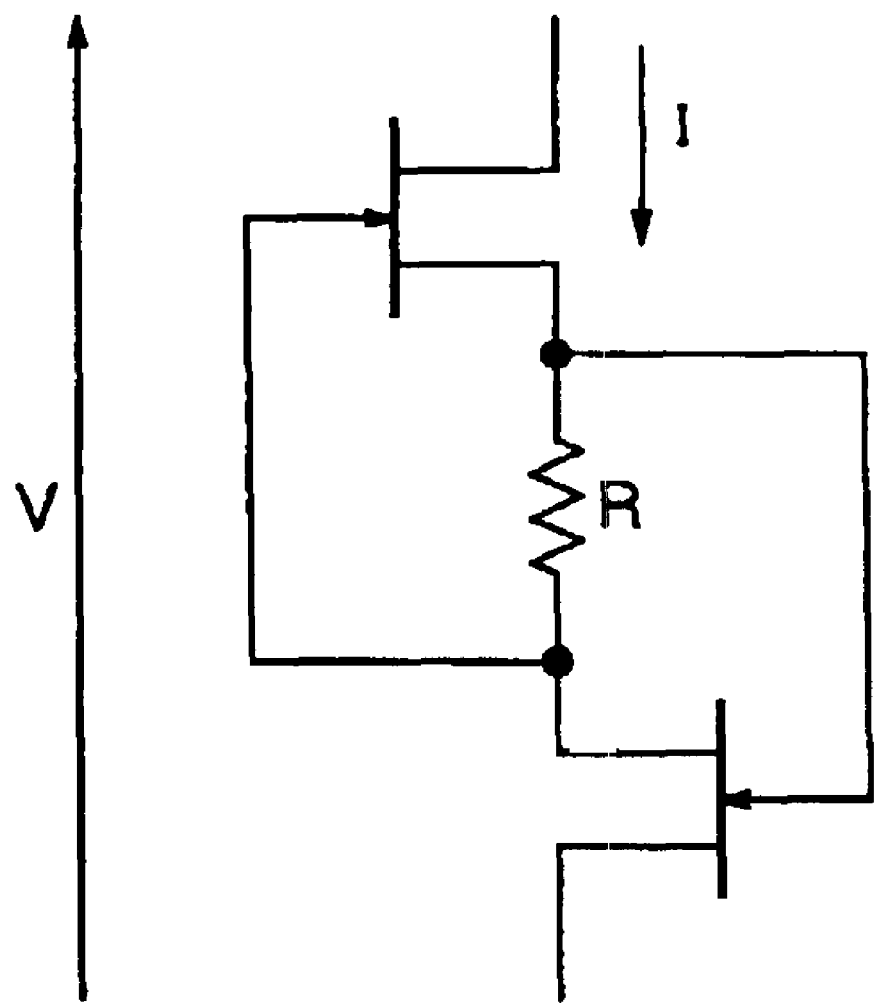
FIG. 14 is another circuit diagram for driving the azimuth meter of the invention.
Figure 15:
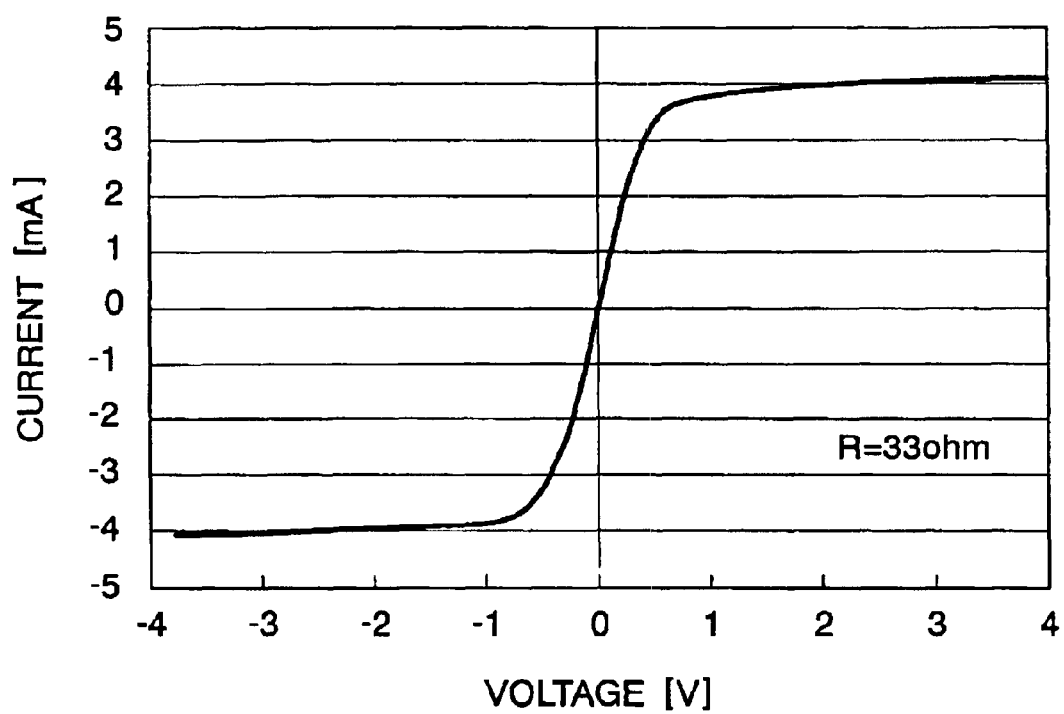
FIG. 15 is a graph explaining circuit characteristics of the invention.

Further improvement will be described in the following. Sometimes, inversion of the IC output takes a long time. In such a case, the charges in the capacitors flow through not only the coil, through which the current to be passed, but also through the resistors Rs1 and Rs2. This is because the current in the resistor increases in proportion to the voltage, and thus, the resistors Rs1 and Rs2 may be replaced with bidirectional constant-current elements, which don't increase the current even if the applied voltage increases. Specifically, the circuit is arranged as shown in FIG. 14, and FIG. 15 shows a characteristic thereof. The junction-type field effect transistor used is the 2SK170, and the resistance is 33Ω. There is exhibited a constant current characteristic of about 4 mA. As a result, the peak value of the current passing through the IC is 32 mA, while it is about 48 mA when the resistors Rs1 and Rs2 are used.

When the bearing is calculated based on the resulting magnetic field strengths of the earth magnetism in the X direction and the Y direction, an arctangent calculation is required. The principal value of the arctangent is from −90 degrees to +90 degrees in cycles. Therefore, at the point of switching, the value in the X direction is small, and thus, malfunction tends to occur. Thus, calculation is preferably performed by dividing the function at +/−45 degrees and +/−135 degrees where the X-directional component and the Y-directional component have large absolute values.

Figure 16:
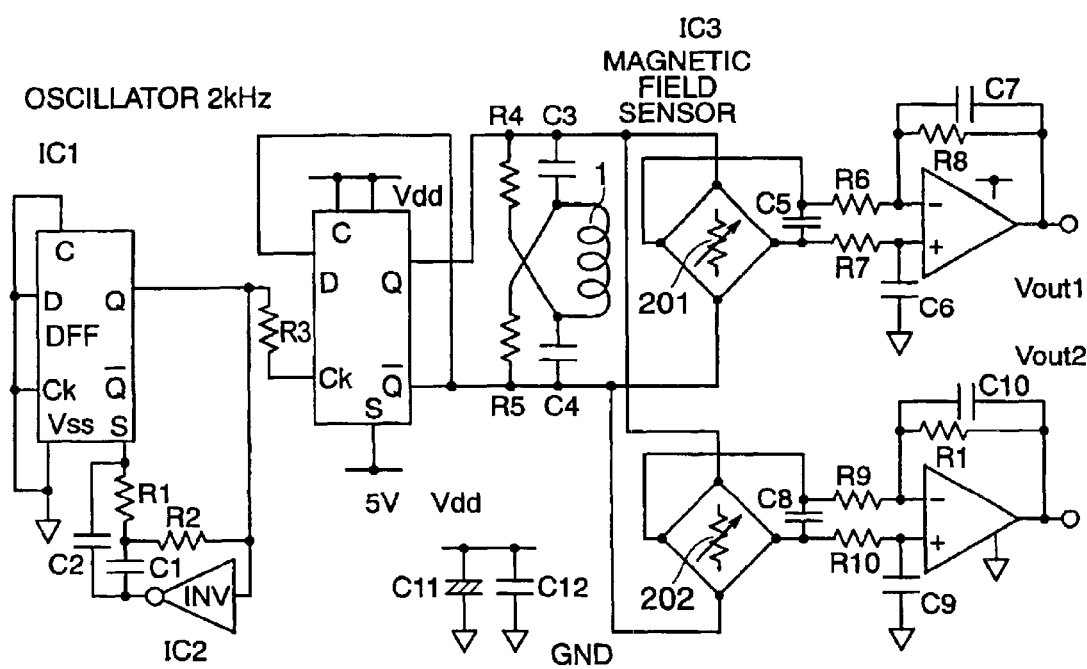
FIG. 16 is a circuit diagram of analog output of the invention.
Figure 17:
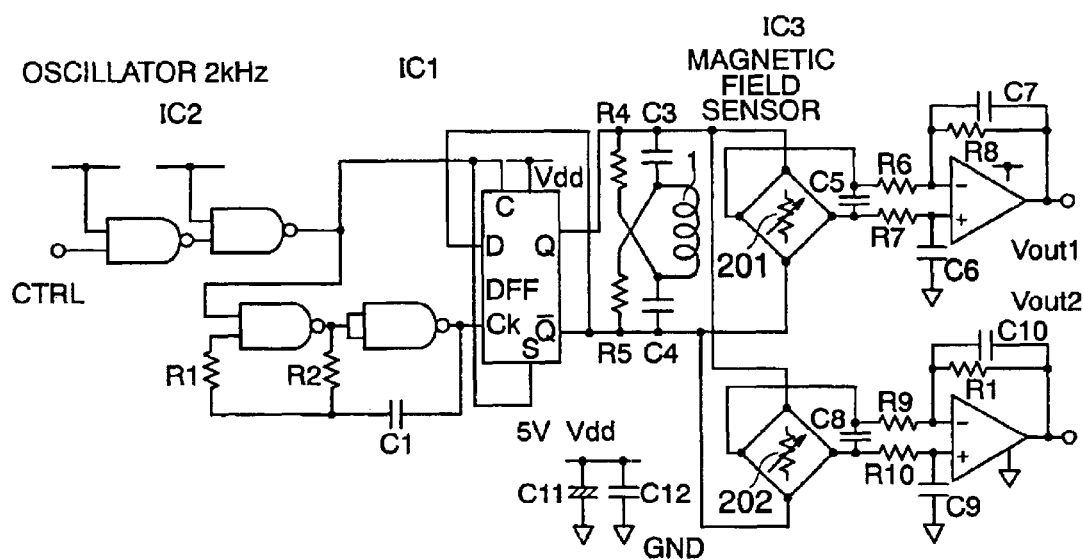
FIG. 17 is another circuit diagram of analog output of the invention.

FIGS. 16 and 17 shows exemplary circuits in the case where an analog output is required. These circuits are the same as the circuit described above in that the coil 1 is driven by the DFF (D-type flip flop) output via a bridge circuit constituted by capacitors C3, C4 and resistors R4, R5, and the operating points 60, 61, 62 and 63 in FIG. 5 are used. However, in this case, after the AD conversion, subtraction cannot be performed digitally, and thus, subtraction is performed in an analog manner. That is, the DFF output is connected not only to the coil 1 for driving thereof but also to the MR bridges 201, 202, and inverted voltages are applied to the MR bridges 201, 202 so that when the MR bridges 201, 202 provide positive outputs at the operating point 61, a negative output is provided at the operating point 63. In this case, if there is no signal, the MR bridges would provide no output. However, normally, the MR bridges produces an offset voltage because of a slight difference between the resistances thereof. As a result, if the time ratio between the positive and negative voltages applied to the MR bridges is accurately set to 1:1, the reference point of the output voltage, which is the average thereof, constitutes the midpoint of the power supply voltage, and accurate measurement can be attained. In the presence of an external magnetic field, if a voltage is applied to the MR bridges in the positive direction and the biasing voltage is also positive, this state corresponds to the operating point 61, and thus, a voltage associated with the resistance level 68 is produced. If the DFF is inverted, the biasing magnetic field is inverted, resulting in the state of the operating point 63. However, since the bridge voltage is also inverted, a voltage associated with the resistance level 66 occurs by being inverted. That is, in this drawing, in the presence of a positive external magnetic field, the MR bridge output constantly provides a negative voltage independently of the polarity of the voltage applied to the MR bridge, and the average value (integral value) thereof is also negative. In this way, an analog voltage continuously associated with the external magnetic field can be provided.

Figure 18:
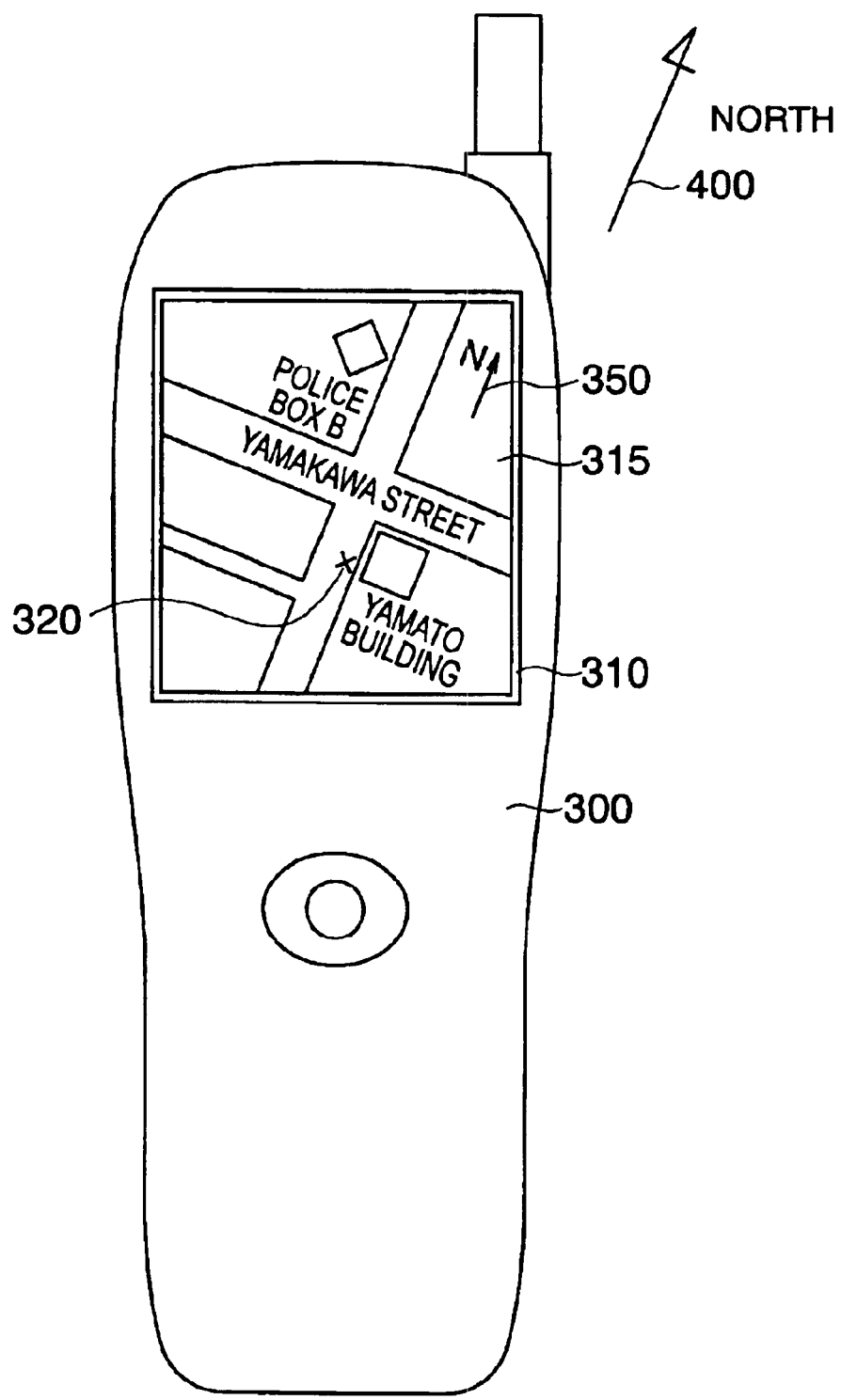
FIG. 18 is a perspective view of a mobile phone with navigation installed with the azimuth meter of the invention.

The azimuth meter according to the invention can provide a mobile device, such as a mobile phone or PDA, with a particularly improved navigation function if it is mounted on the mobile device. In the field of mobile phones, application software for displaying a town map, such as a gourmet guide or hotel guide, has been in practical use. In such application software, in the past, the map has been displayed with the actual bearing and the display screen being fixed. For example, the upper edge of the display screen is associated with the north direction. Thus, if the upper edge of the display screen the mobile phone is not actually directed to the north, the user has to rotate the display screen to direct the upper edge thereof to the north, and this is a burdensome procedure for the user. If the azimuth meter according to the invention is used, there can be provided a mobile device with a navigation function, such as a mobile phone, that can display the map by aligning the bearing of the map displayed on the screen with the actual geographical without regard to the orientation of the display screen of the mobile device. To address an output variation due to an elevation angle, a component for detecting the elevation angle and a correction calculation circuit can be additionally provided. Alternatively, the azimuth meter may be a three-dimensional one to address the same. FIG. 18 is a perspective view of a mobile phone with a navigation function incorporating the azimuth meter according to the invention. Reference numeral 300 denotes a main unit of the mobile phone with a navigation function, and reference numeral 310 denotes a liquid crystal display (LCD) unit.

Figure 19:
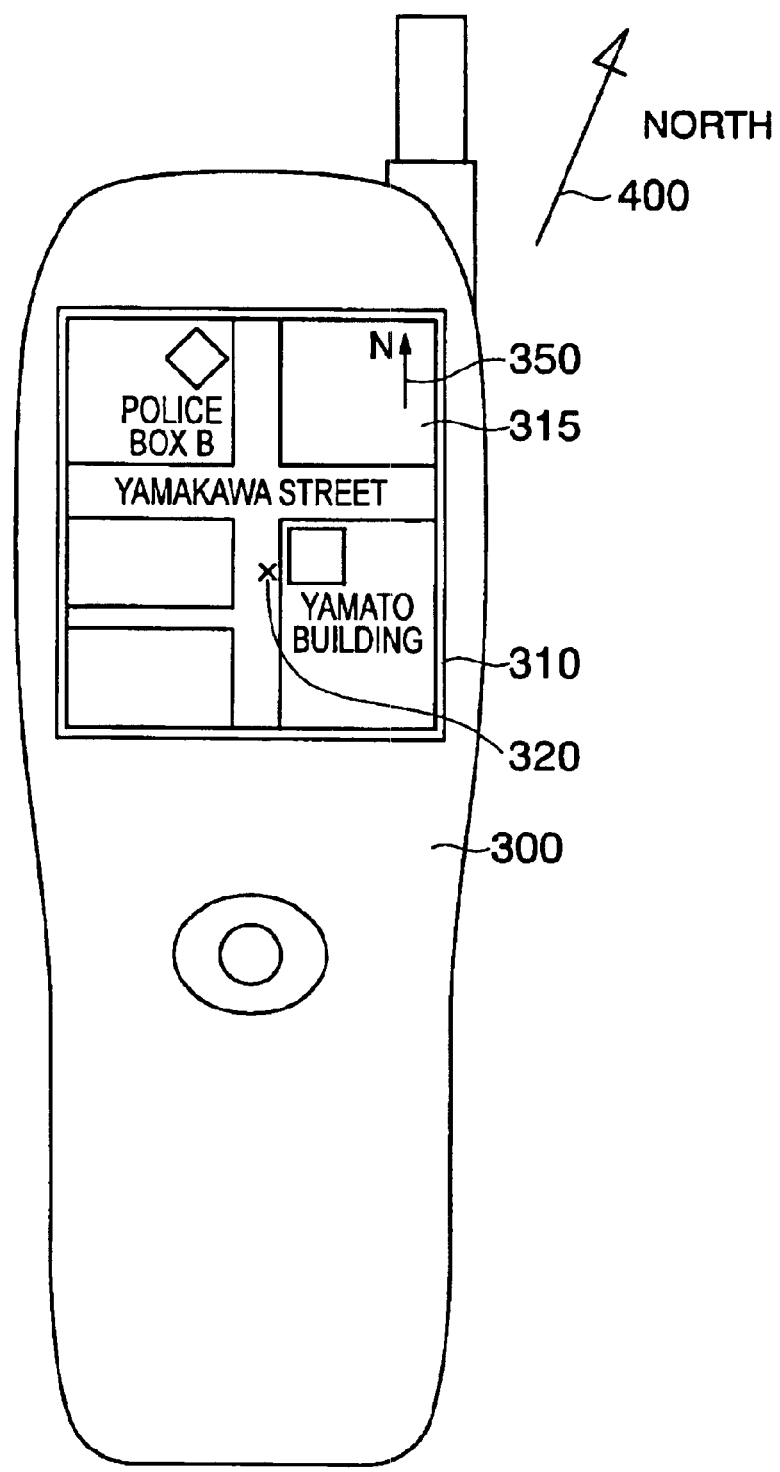
FIG. 19 is a perspective view of a conventional mobile phone with navigation.

For comparison, a conventional example is shown in FIG. 19. Same parts as in those in FIG. 18 are assigned the same reference numerals. The position of the user is indicated by a cross mark 320. The mobile phone with a navigation function according to the invention shown in FIG. 18 can display a map by aligning an actual bearing 400 with a map bearing 350. This is achieved by using the bearing information obtained by the incorporated azimuth meter according to the invention. In the conventional example shown in FIG. 19, no small azimuth element can be incorporated in the mobile phone, and thus, the map bearing 350 indicating the north is fixed on a display screen 315 and is not aligned with the actual bearing 400.

INDUSTRIAL APPLICABILITY

As described above in detail, according to the present invention, since the plane coil is used to apply the saturation magnetic field and biasing magnetic field to the magneto resistive elements, the coil can be made of a thin film, and therefore, the thickness and are of the azimuth meter can be reduced.

With the azimuth meter of the present invention, bearings can be measured by applying biasing magnetic fields in x and y directions simultaneously, so that the number of measurements of bearings can be halved compared to a conventional technique.

In addition, with the process for bearings according to the present invention, since a biasing magnetic field of a predetermined strength is applied in such a manner that the directions of the applied saturation magnetic field and biasing magnetic field are opposite to each other, the output can be increased.

What is claimed is:

1. An azimuth meter, comprising: a plane coil wound into a shape symmetrical with respect to two axes perpendicular to each other; and at least of groups of thin film magneto resistive elements disposed substantially parallel to the plane oft plane coil, in which each of said groups of magneto resistive elements constitutes an MR bridge of an even number of magneto resistive elements electrically connected to each other and detects and outputs two perpendicular components of the earth magnetism, and bearing information is obtained based on the output values, wherein the azimuth meter further comprises: means of passing a current in a predetermined direction through the plane coil to apply thereto a magnetic field that is equal to or higher than a saturation magnetization of said magneto resistive elements, applying a constant biasing magnetic field in the opposite direction, applying a magnetic field equal to or higher than the saturation magnetization of the magneto resistive elements in the direction opposite to said predetermined direction, and then applying a biasing magnetic field in the opposite direction; and means of passing a magnetic field measuring current through the groups of the thin film magneto resistive elements concurrently with the applications of said biasing magnetic fields.

2. The azimuth meter according to claim 1, wherein a circuit is arranged so that, when a power supply voltage is used to apply the magnetic field equal to or higher than the saturation magnetization of the magneto resistive elements, a discharge voltage of a capacitor having been previously charged by a shunt current from the power supply is superimposed to the voltage applied to the plane coil.

3. The azimuth meter according to claim 2, wherein the variation of an angle at which a longitudinal direction of each magneto resistive element intersects the side of a rectangular coil falls within a range of ±5 degrees.

4. The azimuth meter according to claim 1, wherein the plan coil has a rectangular shape, an angle β formed between a longitudinal direction of each magneto resistive element and a side of the plane coil intersecting the magneto resistive element satisfies a relation of sin β×cos β≠0, and an applied magnetic field characteristic in the vicinity of a region where the electrical resistance variation of the magneto resistive element in response to the applied magnetic field is the minimum is used.

5. The azimuth meter according to claim 4, wherein one of the at least two groups of thin film magneto resistive elements is constituted by two pairs of magneto resistive elements to thereby constitute said even number of said magneto restrictive elements, the magneto resistive elements in each pair being disposed intersecting opposite sides of said rectangular coil and being electrically connected to each other, the other of the groups of thin film magneto resistive elements is constituted by two pairs of magneto resistive elements, the magneto resistive elements in each pair being disposed intersecting opposite sides, different from said sides, of said rectangular coil and being electrically connected to each other, and where the longitudinal directions of the two magneto resistive elements disposed on the same side are substantially perpendicular to each other.

6. The azimuth meter according to claim 4, wherein the angle β is any of about 45 degrees, about 135 degrees, about 225 degrees and about 315 degrees.

7. The azimuth meter according to claim 1, in which the two perpendicular components of the earth magnetism are detected by each of the groups of magneto resistive elements and output therefrom, and the bearing information is obtained based on the output values, wherein a circuit is additionally provided which outputs a difference between an output obtained when a bias is applied in a positive direction and an output obtained when a bias is applied in a negative direction.

8. A method for obtaining bearing information comprising:

providing an azimuth meter which comprises: a plane coil wound into a shape symmetrical with respect to two axes perpendicular to each other; and at least two groups of thin film magneto resistive elements disposed substantially parallel to the plane of the plane coil, in which each of said groups of magneto resistive elements constitutes an MR bridge of an even number of magneto resistive elements electrically connected to each other and detects and outputs two perpendicular components of earth magnetism, with bearing information being obtained based on output values therefrom;

wherein said azimuth meter further comprises: means of passing a current in a predetermined direction through said plane coil to apply thereto a magnetic field that is equal to or higher than a saturation magnetization of said magneto resistive elements;

applying a constant biasing magnetic field in the opposite direction;

applying a magnetic field equal to or higher than said saturation magnetization of said magneto resistive elements in a direction opposite to said predetermined direction, and then applying a biasing magnetic field in said opposite direction;

means for passing a magnetic field measuring current through said groups of the thin film magneto resistive elements concurrently with said applications of said biasing magnetic fields, passing said magnetic field measuring current through the plane coil in said predetermined direction to apply to said groups of thin film magneto resistive elements said magnetic field that is equal to or higher than said saturation magnetization of said magneto resistive elements;

applying to said groups of thin film magnetic resistive elements said constant biasing magnetic field in said opposite direction, while passing said magnetic field measuring current through said groups of thin film magneto resistive elements to measure a resulting magnetic field and to obtain an output value from said groups of thin film magneto resistive elements;

applying to said groups of thin film magneto resistive elements said magnetic field equal to or higher than said saturation magnetization of said magneto resistive elements in said direction opposite to said predetermined direction, applying to said groups of thin film magneto resistive elements said biasing magnetic field in said direction opposite to said direction of said magnetic field applied immediately before, which magnetic field applied immediately before is said magnetic field which is equal to or higher than said saturation magnetization of said magneto restrictive elements while passing said magnetic field measuring current through said groups of thin film magneto resistive elements to measure said resulting magnetic field and to obtain an output value from said groups of thin film magneto resistive elements, and obtaining bearing information on said output values.

* * * * *